(12) United States Patent
Ishio et al.

(10) Patent No.: US 6,838,748 B2
(45) Date of Patent: Jan. 4, 2005

(54) SEMICONDUCTOR ELEMENT WITH ELECTROMAGNETIC SHIELDING LAYER ON BACK/SIDE FACE(S) THEREOF

(75) Inventors: Toshiya Ishio, Nabari (JP); Hiroyuki Nakanishi, Soraku-gun (JP); Katsunobu Mori, Nara (JP); Yoshihide Iwazaki, Soraku-gun (JP); Shinji Suminoe, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/434,205

(22) Filed: May 9, 2003

(65) Prior Publication Data
US 2003/0218257 A1 Nov. 27, 2003

(30) Foreign Application Priority Data
May 22, 2002 (JP) ........................................ 2002-148138

(51) Int. Cl.[7] ............................................. H01L 23/552
(52) U.S. Cl. ....................... 257/659; 257/660; 257/728; 257/729; 257/730; 257/780
(58) Field of Search ................................. 257/659, 660, 257/728–730, 788

(56) References Cited
U.S. PATENT DOCUMENTS 5,151,769 A * 9/1992 Immorlica, Jr. et al. .... 257/659
5,864,088 A * 1/1999 Sato et al. ............. 174/35 MS
6,114,751 A * 9/2000 Kumakura et al. ......... 257/666
6,444,372 B1 * 9/2002 McCullough ................ 430/5
6,472,724 B1 * 10/2002 Matsuzawa et al. ........ 257/659
2002/0166686 A1 * 11/2002 Toyoda et al. ............. 174/52.1

FOREIGN PATENT DOCUMENTS

| JP | 08288686 A | * 11/1996 | ............ H05K/9/00 |
| JP | 10-256412 | 9/1998 | |
| JP | 2000312127 A | * 11/2000 | .......... H03H/9/145 |

* cited by examiner

Primary Examiner—Tom Thomas
Assistant Examiner—Matthew E. Warren
(74) Attorney, Agent, or Firm—Nixon & Vanderhye P.C.

(57) ABSTRACT

A semiconductor chip of the present invention is so arranged that a front face on which an element circuit is formed has electrode pads and a side face and a back face are coated with a shielding layer for shielding electromagnetic waves. With this, it is possible to provide a semiconductor element capable of being easily manufactured into a smaller semiconductor device compared with a conventional semiconductor device equipped with a shielding cap; a semiconductor device; and a method for manufacturing a semiconductor element.

18 Claims, 19 Drawing Sheets

SEMICONDUCTOR ELEMENT WITH ELECTROMAGNETIC SHIELDING LAYER ON BACK/SIDE FACE(S) THEREOF

FIELD OF THE INVENTION

The present invention relates to a semiconductor element having a shielding structure, a semiconductor device, and a method for manufacturing a semiconductor element.

BACKGROUND OF THE INVENTION

In these years, in accordance with the miniaturization of electronic equipments, there is a growing demand for electronic parts such as a semiconductor device that can realize miniaturization and high-density packaging. In response to this demand for higher density, it is required to mount both analog and digital circuits together, or devices having high clock frequency together. In these cases, noise is known to generate among the closely located devices due to electromagnetic waves.

In order to shield a semiconductor device or module that is susceptible to electromagnetic waves from a semiconductor device or module that considerably generates electromagnetic waves, a whole semiconductor device or module is generally covered with a metal cap called a shielding cap, etc.

As an example of this kind of semiconductor device, Japanese Unexamined Patent Publication No. 256412/1998 (Tokukaihei 10-256412; published on Sep. 25, 1998) proposes a semiconductor device having a structure as shown in FIG. 19, together with its manufacturing method.

As shown in FIG. 19, the above semiconductor device is arranged as follows. A semiconductor device main body 110 is so arranged that a semiconductor chip (semiconductor element) 102 is mounted on a rectangular wiring substrate 101, and a protruded external connecting terminal 103 is provided on a back face of the wiring substrate 101. Then, the semiconductor device main body 110 is covered with a shielding cap 121 having a rectangular parallelepiped shape with an open bottom face so that top and side faces of the semiconductor device main body 110 are covered, and the shielding cap 121 is adhered to the semiconductor device main body 110 with an adhesive agent 122.

On a front side of the semiconductor chip 102, an element circuit (not shown) is formed. The semiconductor chip 102 is mounted on the wiring substrate 101 either using an upset so as to be electrically connected to the wiring substrate 101 by a bonding wire 104, or using a downset by a flip chip connecting method. The mounted semiconductor chip 102 is covered with sealing resin 105.

The material of the shielding cap 121 is a gold-plated or tin-plated metal such as copper, or nickel silver. The dimensions of a storing section of the shielding cap 121 in a horizontal direction is a little larger than the size of the wiring substrate 101 so as to fully cover the semiconductor device main body 110. Further, inside the side faces of the shielding cap 121 is provided with a pressed protrusion 123 for fixing the wiring substrate 101.

A method for manufacturing the above-described semiconductor device will be explained as follows. After the semiconductor device main body 110 is formed, the adhesive agent 122 is thickly put on the sealing resin 105 on the semiconductor device main body 110 using a dispense nozzle (not shown); the shielding cap 121 attached by attaching conveying means (not shown) is put on from above and pushed into a fixed position; and then curing treatment is applied.

However, the conventional semiconductor device and the conventional method for manufacturing the semiconductor element have the following problems.

(A) The whole semiconductor device becomes very large, because the semiconductor device main body 110 larger than the chip size is further covered with the shielding cap 121.

(B) It is required to prepare the shielding cap 121 variously in accordance with the semiconductor device main bodies 110 in different sizes.

(C) The application is limited to an area array such as a BGA (Ball Grid Array).

(D) The assembling steps become complicated, because, after the semiconductor device main body 110 is assembled, each semiconductor device main body 110 has to undergo the steps of dispensing the adhesive agent 122, covering with the shielding cap 121 that is press-molded and subjected to plating, etc., and curing the adhesive agent 122.

(E) It is difficult to shield a back face (external connecting terminal side) of the semiconductor device.

SUMMARY OF THE INVENTION

An object of the present invention is to provide a semiconductor element capable of being easily manufactured into a smaller semiconductor device compared with a conventional semiconductor device equipped with a shielding cap; a semiconductor device; and a method for manufacturing a semiconductor element.

In order to attain the foregoing object, a semiconductor element of the present invention, whose front face on which an element circuit is formed has electrode pads and whose side face is provided between the front face and a back face on a back side of the front face, is characterized in that the side face and the back face are coated with a shielding layer for shielding electromagnetic waves.

Namely, the conventional semiconductor device has a problem such that the entire size of the semiconductor device becomes very large, because the semiconductor device is covered with a shielding cap.

With the present invention, however, the side and back faces of the semiconductor element are coated with the shielding layer for shielding electromagnetic waves. In other words, the semiconductor element is directly coated with the shielding layer.

As a result, it becomes possible to provide a semiconductor element capable of being easily manufactured into a smaller semiconductor device compared with the conventional semiconductor device equipped with a shielding cap. This also eliminates the need for manufacturing the shielding cap variously in accordance with different shapes and sizes of the semiconductor devices, so that a pressing mold becomes unnecessary. This obviates the complexities of manufacturing and managing various kinds of shielding caps.

In order to attain the foregoing object, a semiconductor device of the present invention is characterized in that an external connecting terminal is formed on a semiconductor element, whose front face on which an element circuit is formed has electrode pads and whose side face is provided between the front face and a back face on a back side of the front face, the side face and the back face being coated with a shielding layer for shielding electromagnetic waves.

With this arrangement, the semiconductor device is so arranged that an external connecting terminal is formed on the above-described semiconductor element. Namely, the semiconductor device is composed of a semiconductor element of the electromagnetic wave shielding type as arranged above.

With this, it becomes possible to provide a smaller semiconductor device compared with the conventional semiconductor device equipped with a shielding cap. This also eliminates the need for manufacturing the shielding cap variously in accordance with different shapes and sizes of the semiconductor devices, so that a pressing mold becomes unnecessary. This obviates the complexities of manufacturing and managing various kinds of shielding caps.

In order to attain the foregoing object, a method for manufacturing a semiconductor element of the present invention is characterized so as to have the steps of (1) fixing a sheet or plate material on a front face of a wafer on which an element circuit, electrode pads, and a cutting line that is formed so as to surround the element circuit and the electrode pads are formed, respectively; (2) forming a groove along the cutting line on a back face which is on a back side of the wafer front face; (3) forming a shielding layer so as to shield electromagnetic waves on the wafer back face having the groove and on a concave portion of the groove; and (4) removing the sheet or plate material fixed on the wafer front face, the steps (1) through (4) being processed in this order.

With this method, when manufacturing the semiconductor element, first, (1) a sheet or plate material is fixed on a front face of a wafer on which an element circuit, electrode pads, and a cutting line that is formed so as to surround the element circuit and the electrode pads are formed, respectively. Next, (2) a groove is formed along the cutting line on a back face which is on a back side of the wafer front face. Then, (3) a shielding layer for shielding electromagnetic waves is formed on the wafer back face having the groove and on a concave portion of the groove. After this, (4) the sheet or plate material fixed on the wafer front face is removed.

With this, it is possible to provide a method for manufacturing a semiconductor element whose back and side faces have the electromagnetic wave shielding structure.

For a fuller understanding of the nature and advantages of the invention, reference should be made to the ensuing detailed description taken in conjunction with the accompanying drawings.

BRIEF DESCRIPTION OF THE DRAWINGS

FIG. 4(*a*) is the front view, FIG. 4(*b*) is the plan view, and FIG. 4(*c*) is the bottom plan view.

FIG. 5(*b*) is a side view showing the blade.

FIG. 7(*a*) shows a case where a vertical groove is formed. FIG. 7(*b*) shows a case where a groove is formed on a back face of a wafer whose thickness is reduced by back face polishing. FIG. 7(*c*) shows a case where a taper is formed on side faces of a wafer.

FIG. 8(*a*) shows a case where a vertical groove is formed. FIG. 8(*b*) shows a case where a groove is formed on a back face of a wafer whose thickness is reduced by back face polishing. FIG. 8(*c*) shows a case where a taper is formed on side faces of a wafer.

FIG. 9(*a*) shows a case where a vertical groove is formed. FIG. 9(*b*) shows a case where a groove is formed on a back face of a wafer whose thickness is reduced by back face polishing. FIG. 9(*c*) shows a case where a taper is formed on side faces of a wafer.

DESCRIPTION OF THE EMBODIMENTS

[First Embodiment]

The following will explain an embodiment of the present invention with reference to FIGS. 1 through 9(*a*) to 9(*c*).

Figure 1:
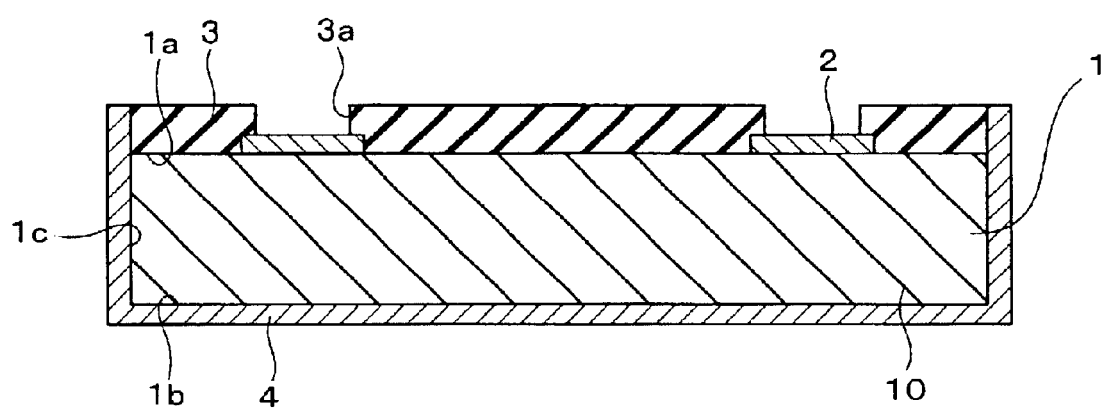
FIG. 1 is a cross-sectional view showing an embodiment of a semiconductor chip of the present invention.

As shown in FIG. 1, a semiconductor chip (semiconductor element) 1 of the present embodiment is a semiconductor chip of a shielding type. The semiconductor chip 1 is provided with an element circuit (not shown) on a front face side. Further, a chip front face (element front face) 1*a* of the semiconductor chip 1 is provided with a passivation film 3 having an opening 3*a* only on a portion of an electrode pad 2. The passivation film 3 is composed of an inorganic material such as $SiO_2$ and SiN, or an organic material such as polyimide. Two or more passivation films 3 may be provided. Note that, the manufacturing process of a semiconductor device generally consists of a wafer process called as a front-end process and an assembling process (packaging) called as a back-end process. The passivation film 3 is generally formed in a last step of the wafer process, because the passivation film 3 is formed to protect the semiconductor element from thermal or physical stress applied in the back-end process, etc.

In the present embodiment, a chip back face (element back face) 1*b* and a chip side face (element side face) 1*c* of the semiconductor chip 1 are covered with a shielding layer 4. The shielding layer 4 is composed of a conductive material such as Au. As a foundation layer of the shielding layer 4, an insulating layer (not shown) is formed to surely insulate the shielding layer 4 from a chip main body 10. The method for forming the insulating layer may be various methods such as a method of applying resin varnish, but a CVD (Chemical Vapor Deposition) method, which is capable of uniformly forming a thin film, is used to form an oxide film here.

Figure 2:
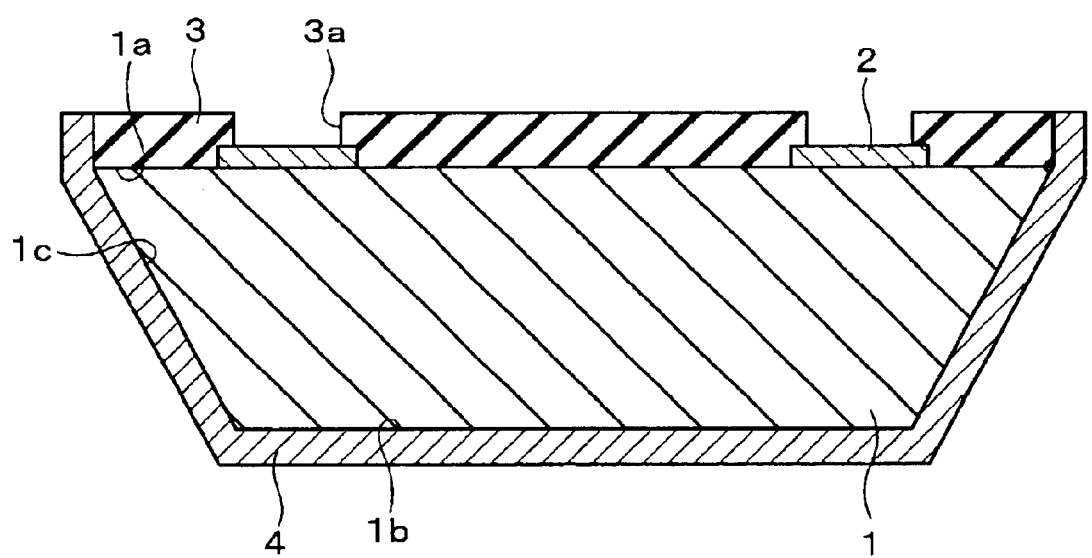
FIG. 2 is a cross-sectional view showing a semiconductor chip whose side faces have a taper.

Note that, the above-described semiconductor chip 1 has a rectangular cross-sectional shape, but the cross-sectional shape of the semiconductor chip 1 is not limited to this. For example, as shown in FIG. 2, the chip side face 1*c* of the semiconductor chip 1 may have a taper. Namely, the chip back face 1*b* has a smaller area than the chip front face 1*a* on which the element circuit is formed.

With this tapered shape, when the shielding layer 4 is formed by vapor-phase or liquid-phase growth, the shielding layer 4 can be formed to have a uniform thickness on the chip back face 1*b* and the chip side face 1*c* of the semiconductor chip 1. Namely, it is possible to prevent the shielding layer 4 from being partly thinned or punctured on the chip side face 1*c* of the semiconductor chip 1. Further, the insulating layer (not shown) as the foundation layer of the shielding layer 4 also can be formed to have a uniform thickness on the back face and the side face, thereby effectively maintaining the uniformity of the film.

Next, a method for manufacturing the semiconductor chip 1 as arranged above will be explained with reference to FIGS. 3(*a*) through 3(*d*).

Figure 3:
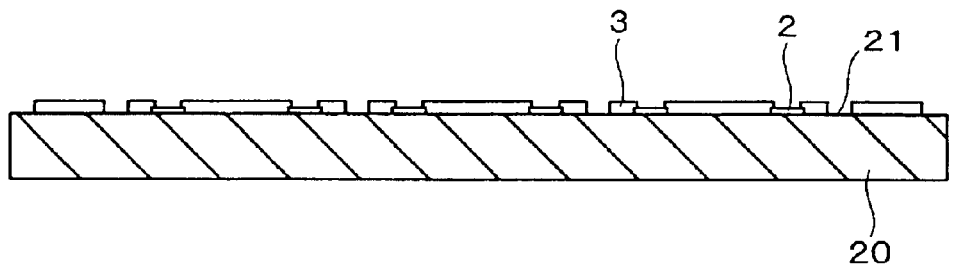
FIGS. 3(*a*) through 3(*d*) are cross-sectional views showing manufacturing steps of the semiconductor chip.
Figure 3:
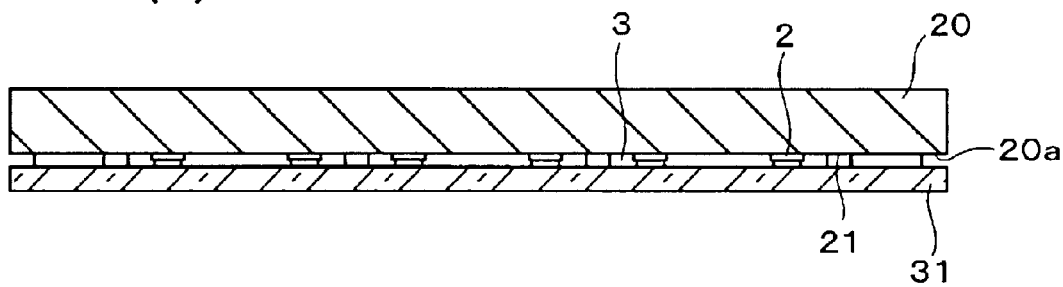
Figure 3:
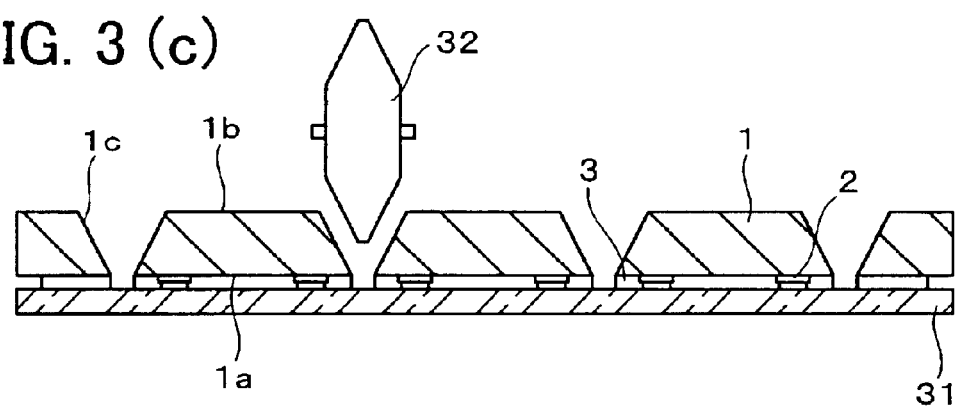
Figure 3:
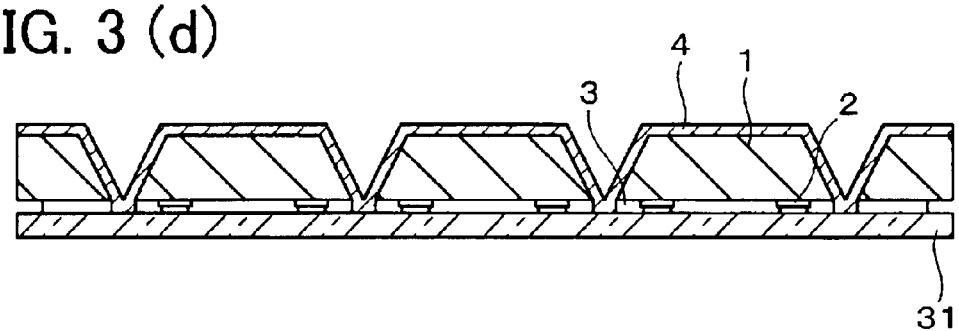

First, as shown in FIG. 3(*a*), prepared is a wafer 20 whose front face is provided with the element circuit (not shown), the electrode pads 2, and the passivation film 3 which is formed on a portion except the element circuit, the electrode pads 2, and scribe lines (cutting lines) 21. Here, the scribe line 21 is a lined area that is to be cut in a later step in which the wafer 20 is separated into individual pieces.

Next, as shown in FIG. 3(*b*), a wafer front face 20*a* of the wafer 20 is fixed on a jig 31. The jig 31 may be made of any material having a smooth surface and sufficient tolerance for later steps. For example, the material includes a metal material such as stainless steel and aluminum, a plate material such as glass and a silicon wafer, and a tensioned heat-resistant resin sheet of polyimide such as upilex. Note that, when using the tensioned heat-resistant resin sheet, it is preferable to use it after attached to a ring jig, etc., that is used in steps such as a dicing step for cutting the wafer into individual pieces.

The wafer 20 can be fixed on the above-described material when an adhesive agent is applied on the above-described material. When the adhesive agent has a glass transition point Tg of not less than 200° C., for example, the adhesive agent has tolerance for later steps. Further, since the later steps include a peeling process, it is preferable to use an adhesive agent whose adhesion can be lowered by UV irradiation, chemicals such as acetone, heating, etc.

In the present embodiment, the jig 31 made of glass is used, and a thermoplastic adhesive agent made of polyimide is used as the adhesive agent. Further, the adhesive agent is used by being applied on the jig 31. Generally, this kind of adhesive agent is used for secure fixing by compression bonding at a high temperature of not less than 350° C. However, in this case, the jig is only fixed so as not to be peeled during the steps, so that thermo compression bonding is lightly carried out at a temperature of approximately 250° C. This adhesion enables separation at a surface of the adhesive agent in the later peeling step.

Further, after the glass jig 31 larger than the wafer 20 is pasted on the wafer 20, by marking scribe line positions on an exceeding portion of the glass surface, the wafer 20 can be subjected to dicing. Note that, when the jig 31 is not made of a transparent material, by marking the scribe line positions on a back face of the wafer 20 using a laser, etc., the wafer 20 can be subjected to dicing.

Figure 4:
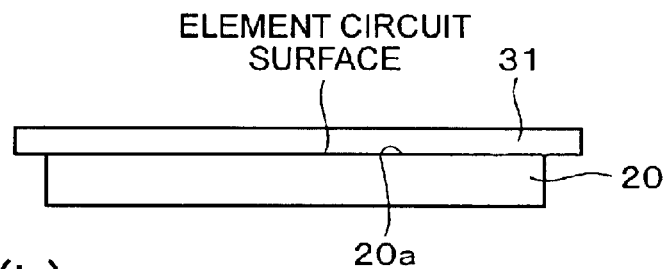
FIGS. 4(*a*) through 4(*c*) show a state where a wafer is equipped with a jig in the manufacturing steps.
Figure 4:
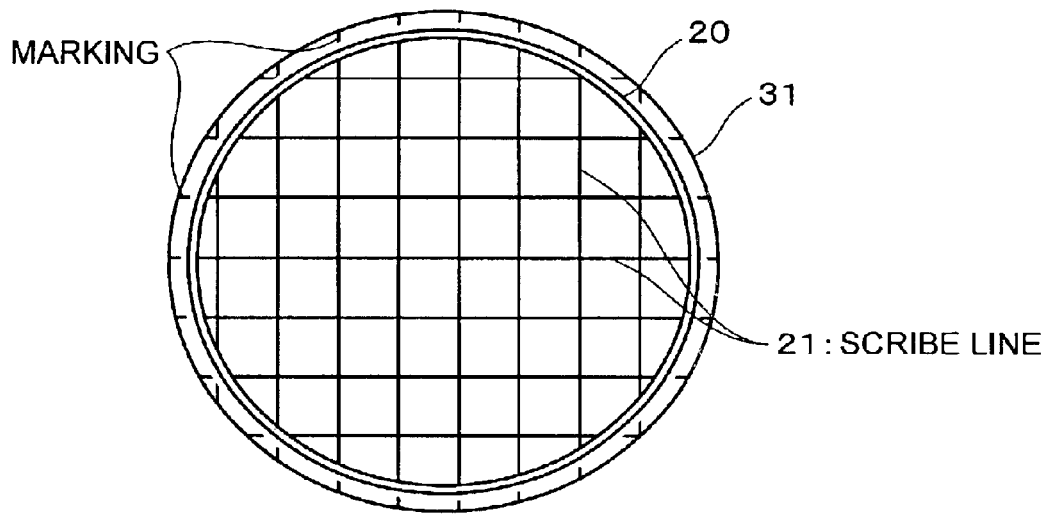
Figure 4:
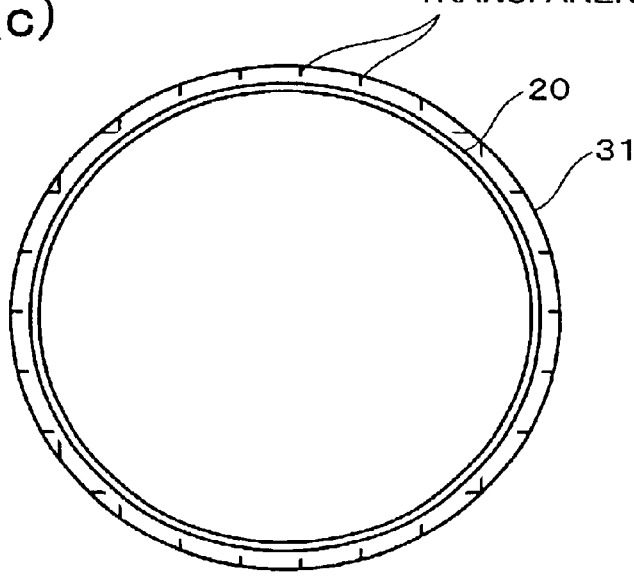

Specifically, as shown in FIG. 4(*a*), the glass jig (sheet or plate material) 31, which is a little larger than the wafer 20, is pasted on the wafer 20 on a side of the element circuit formed on the wafer front face 20*a*. The scribe line positions are marked on the front surface of the jig 31 (in FIG. 4(*a*), from above of the sheet planar surface), as shown in FIG. 4(*b*). Note that, only a peripheral portion of the jig 31 may be marked. When the marked jig 31, etc. is seen from the back side of the wafer 20 (in FIG. 4(*a*), from below of the sheet planar surface), the marking is visible because the jig 31 is made of transparent glass. As a result, using the marking as a reference, the wafer 20 can be subjected to dicing from the back face.

Following this, as shown in FIG. 3(*c*), the wafer 20 is subjected to dicing at the scribe lines 21 using a blade 32. Note that, a blade for dicing is generally disk-shaped and has a uniform thickness of approximately 50 μm. However, since the blade having a uniform thickness creates vertical cut surfaces, it is difficult to achieve the uniform thickness of the shielding layer 4, etc. in a next step. As a method to prevent this, the back face of the wafer 20 may be polished so that the wafer 20 has the thickness of not more than about 200 μm, for example, thereby achieving a certain degree of uniformity of the film. Namely, wafer thickness is generally predetermined. More specifically, a 4-inch wafer has a thickness of 525 μm, a 6-inch wafer has a thickness of 625 μm, and an 8-inch wafer has a thickness of 725 μm. Therefore, by polishing the wafer to have a thickness of not more than about 200 μm, it is possible to maintain a certain degree of uniformity of the film.

Figure 5:
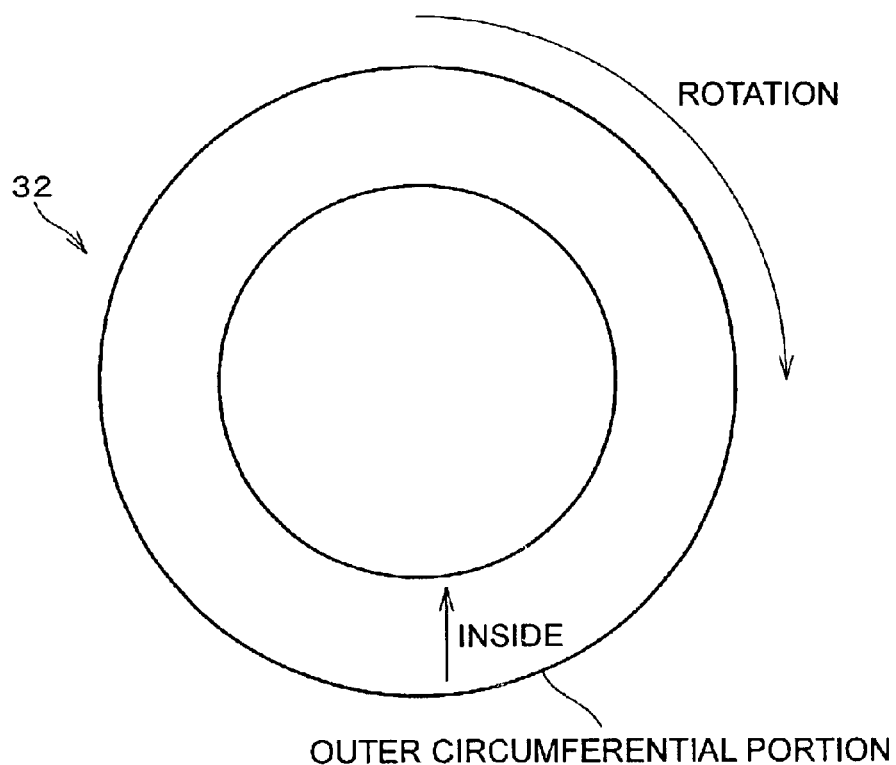
FIG. 5(*a*) is a front view showing a blade used in the manufacturing steps.
Figure 5:
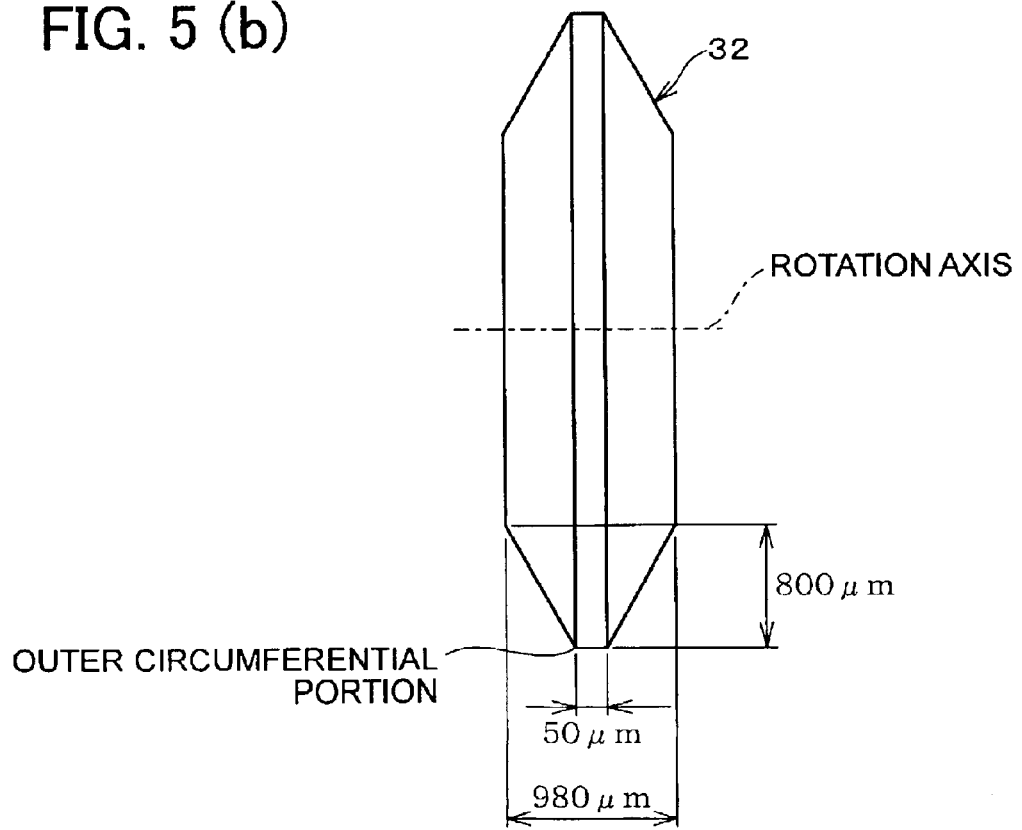
Figure 6:
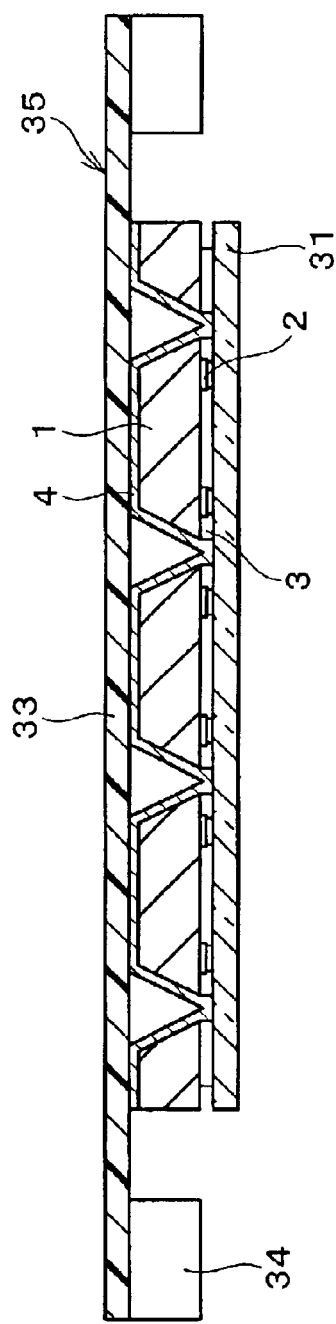
FIGS. 6(*a*) and 6(*b*) are cross-sectional views showing manufacturing steps of the semiconductor chip after those shown in FIGS. 3(*a*) through 3(*d*).
Figure 6:
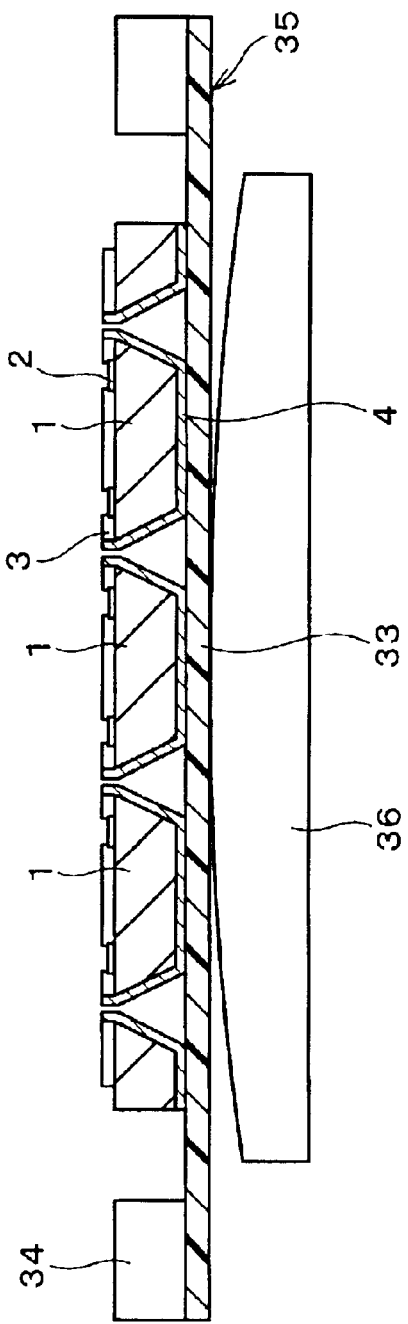
Figure 7:
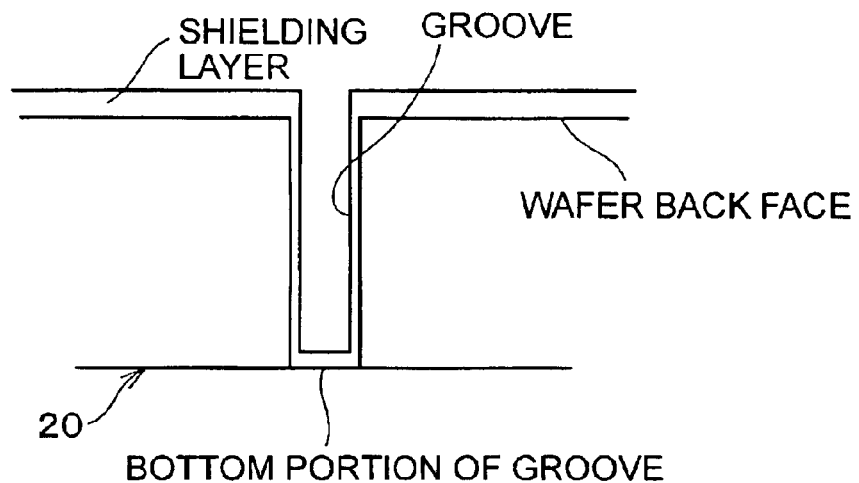
FIGS. 7(*a*) through 7(*c*) are cross-sectional views each showing how a shielding layer is formed when a shielding layer of a conductive material is formed only by sputtering.
Figure 7:
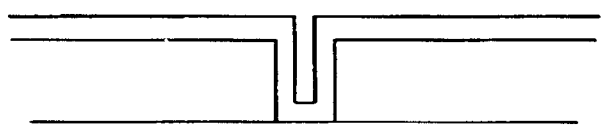
Figure 7:
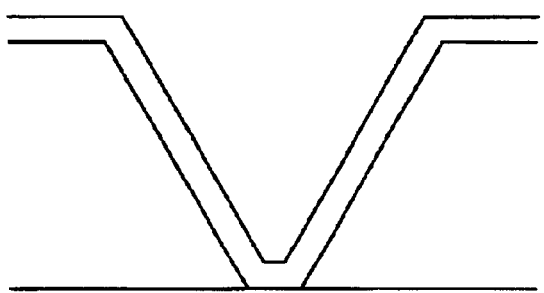
Figure 8:
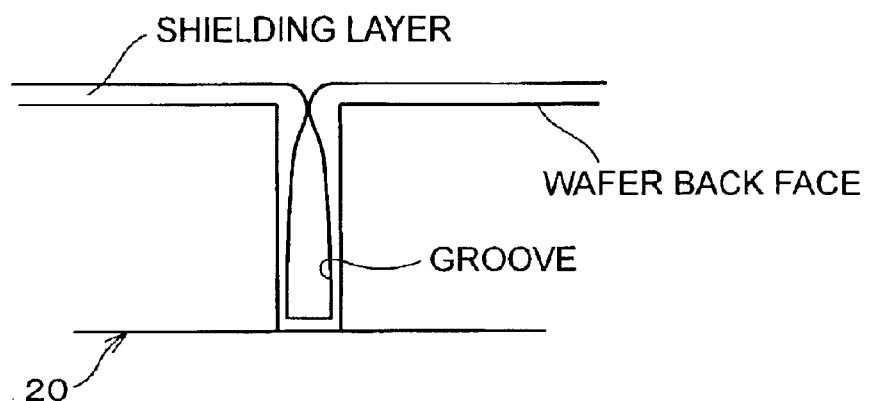
FIGS. 8(*a*) through 8(*c*) are cross-sectional views each showing how a shielding layer is formed when a shielding layer of a conductive material is formed by sputtering and subsequent electrolytic plating.
Figure 8:
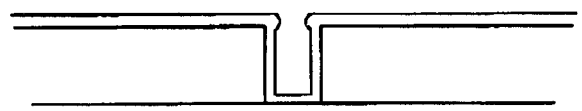
Figure 8:
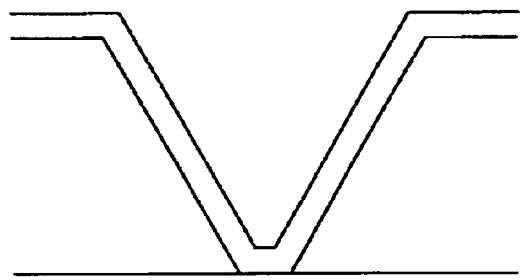
Figure 9:
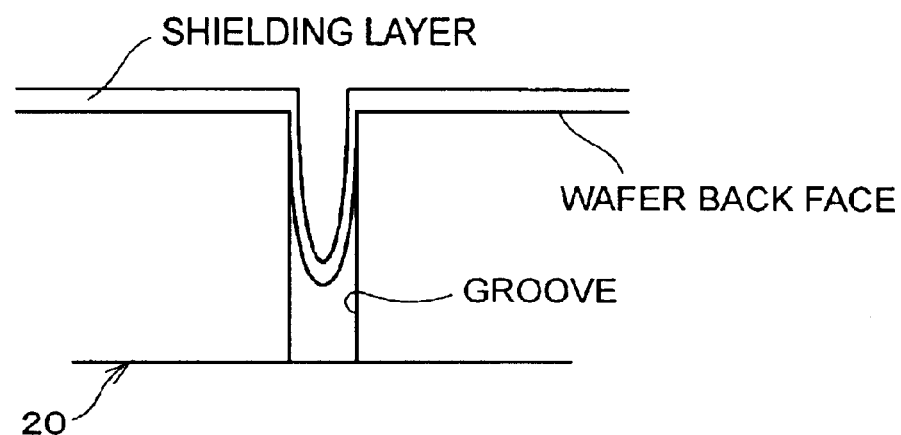
FIGS. 9(*a*) through 9(*c*) are cross-sectional views each showing how a shielding layer is formed when a shielding layer is made of a resin sheet as an example of an electromagnetic wave absorbing material.
Figure 9:
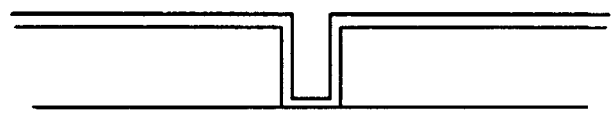
Figure 9:
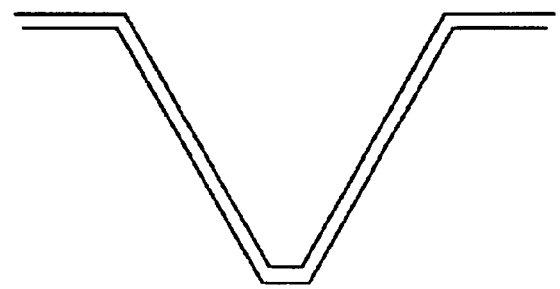
Figure 10:
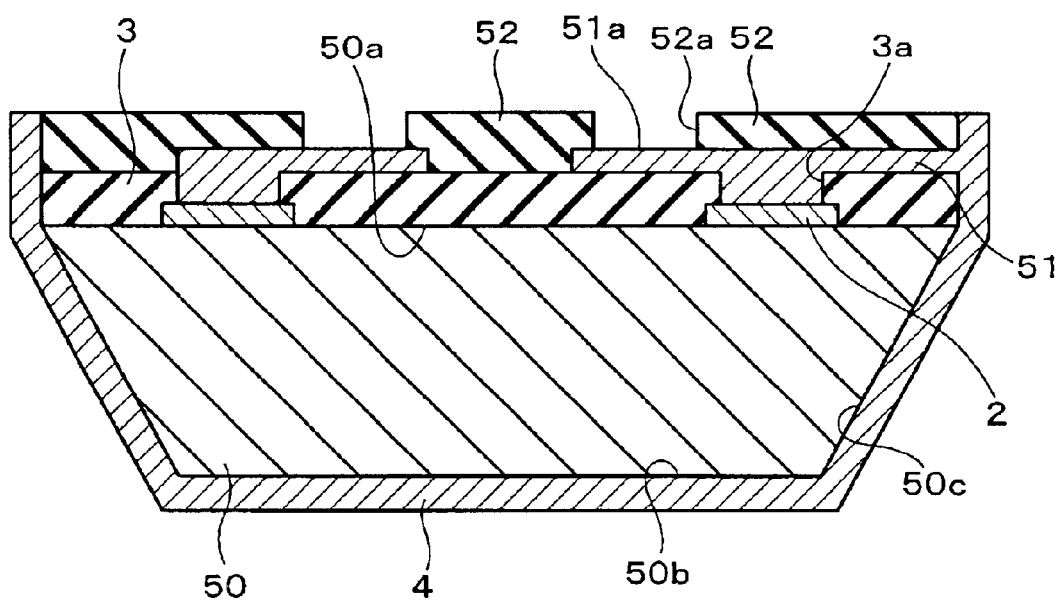
FIG. 10 is a cross-sectional view showing another embodiment of the semiconductor chip of the present invention.
Figure 11:
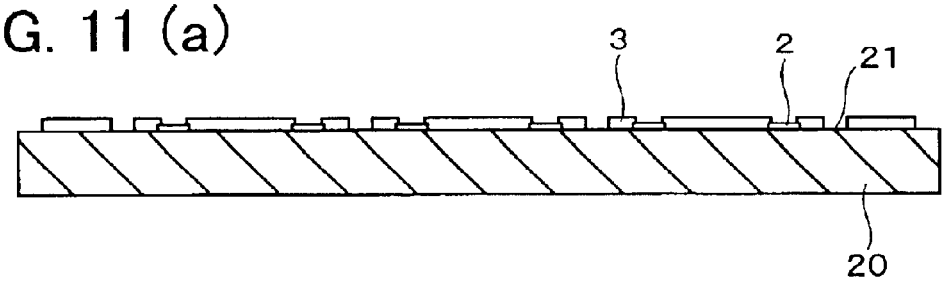
FIGS. 11(*a*) through 11(*e*) are cross-sectional views showing manufacturing steps of the above semiconductor chip.
Figure 11:
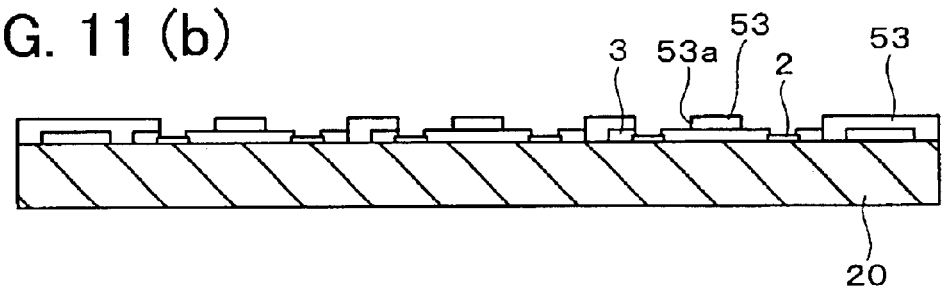
Figure 11:
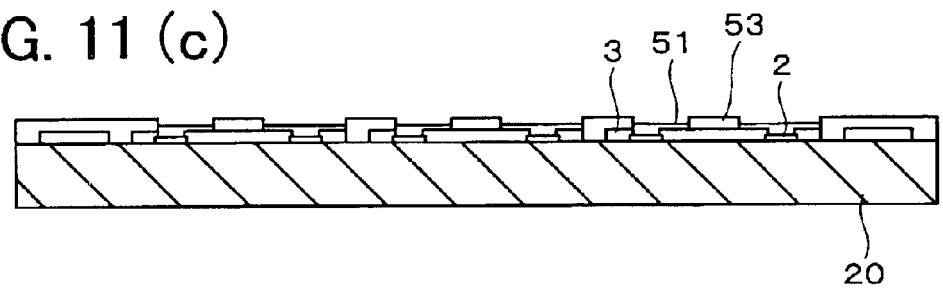
Figure 11:
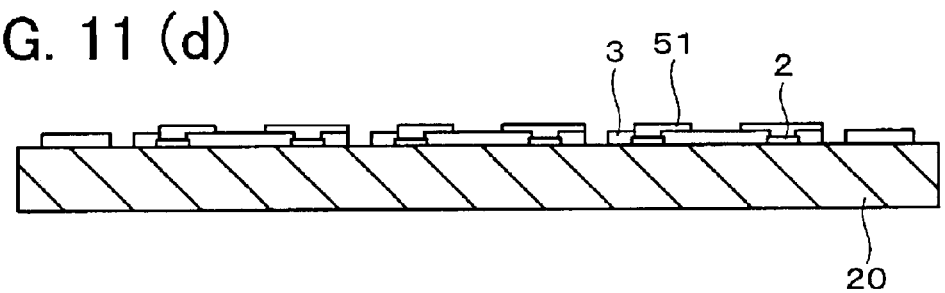
Figure 11:
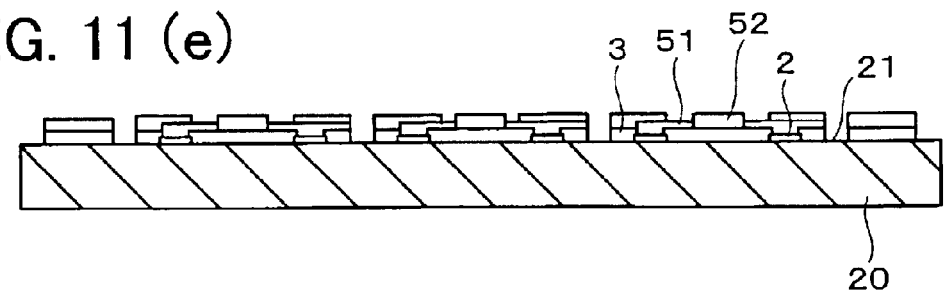
Figure 12:
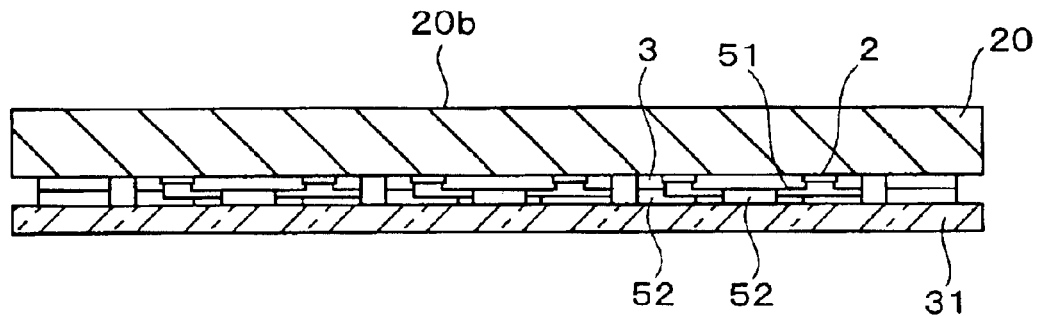
FIGS. 12(*a*) through 12(*c*) are cross-sectional views showing manufacturing steps of the above semiconductor chip after those shown in FIGS. 11(*a*) through 11(*e*).
Figure 12:
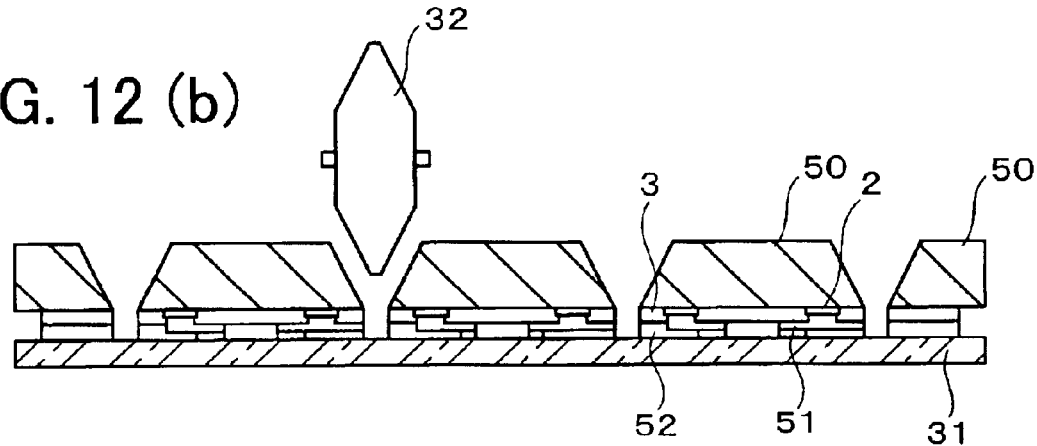
Figure 12:
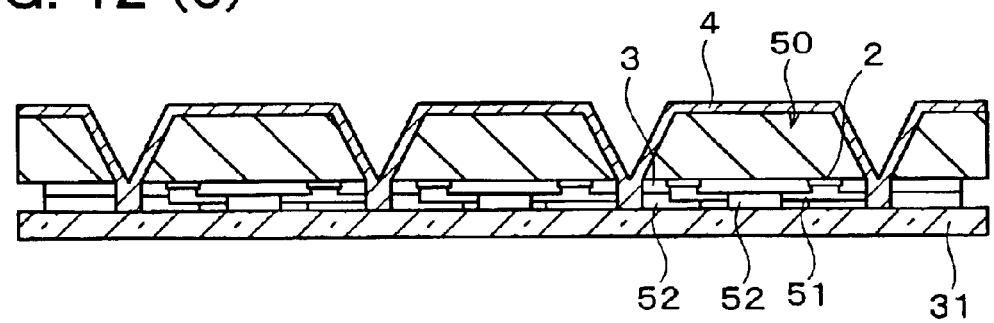
Figure 13:
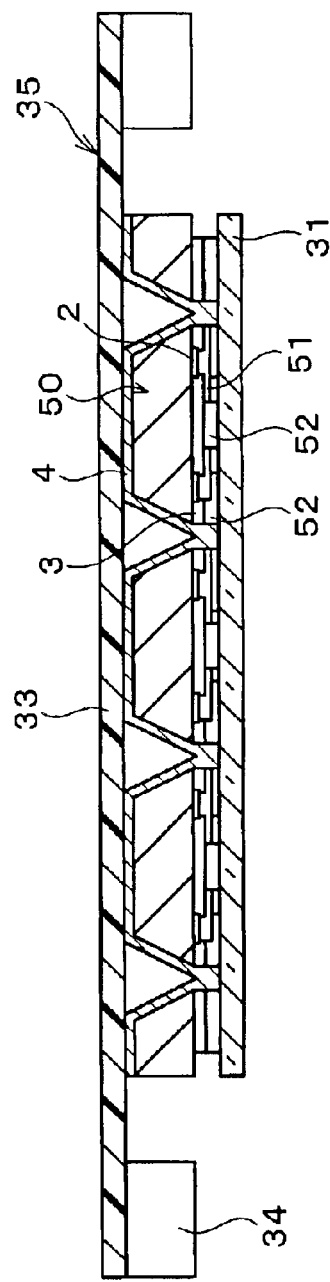
FIGS. 13(*a*) and 13(*b*) are cross-sectional views showing manufacturing steps of the above semiconductor chip after those shown in FIGS. 12(*a*) through 12(*c*).
Figure 13:
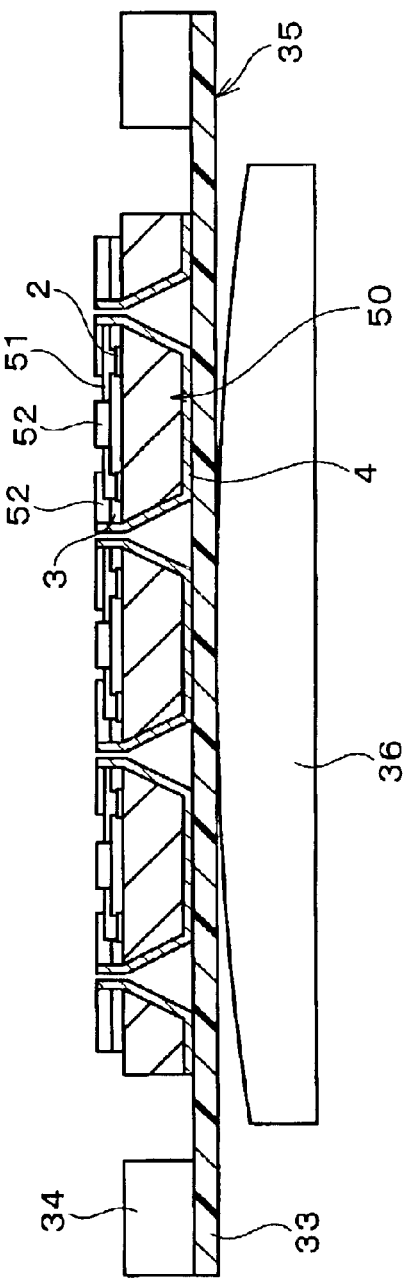

On the other hand, as another method to maintain the uniform thickness of the shielding layer 4, etc., a circular blade 32 having different thicknesses at outer and inner circumferential portions is used in the present embodiment, as shown in FIGS. 5(*a*) and 5(*b*). The outer circumferential portion of the blade 32 has a thickness of 50 μm, whereas an inner circumferential portion that is 800 μm radially inside the outer circumferential portion has a thickness of 980 μm. By using this blade 32, when the circular blade 32 rotates on a rotation axis so as to form a groove on an object, a taper is formed on the chip side face 1*c* of the semiconductor chip 1 that is separated from the wafer 20, allowing the chip front face 1*a* to have a larger area than the chip back face 1*b*. Further, in the present embodiment, by using this blade 32, it is possible to maintain the uniform thickness of the shielding layer 4, etc., as later described. Note that, the taper is formed so as to have a point angle of 60° here. However, as the angle becomes larger, it becomes easier to form a uniform film such as the shielding layer 4 in a later step.

Further, other methods to form the taper include wet etching, laser irradiation at different angles, etc.

Next, as shown in FIG. 3(d), the insulating film (not shown) as the foundation layer of the shielding layer 4 is formed by a photo-assisted CVD method. Note that, various methods for forming the insulating film may be employed. For example, sheet resin such as polyimide may be pasted on so as to wrap the semiconductor chip 1, while being heated under reduced pressure with respect to the jig 31. Employed here is the CVD method, which can uniformly form a thin insulating film. There are several types in the CVD method, but it is preferable to use the photo-assisted CVD, which can form an oxide film at a relatively low temperature. Using $SiH_4$—$N_2O$ as a reactive material, the oxide film is formed.

Next, the shielding layer 4 is formed in such a manner that Au is formed to have a thickness of approximately 1 μm by sputtering. The shielding layer 4 may be formed thicker by electrolytic Au plating if necessary. When the electrolytic plating is applied, the film formed by the sputtering may have a thickness of only about 0.1 μm in view of a time for forming the film. Further, since Au is expensive, other metal materials such as Cu may be used. In this case, Cu is formed by sputtering. Note that, when it is necessary to form Cu thicker, various methods may be employed such that Cu is further formed by electrolytic plating. Further, other than metal, a material that absorbs electromagnetic waves may be used. For example, when a resin sheet containing powder ferrite is heated under reduced pressure with respect to the jig 31, the resin sheet fits and adheres to the indented surface. In this method, by polishing the chip back face 1b of the semiconductor chip 1 so that the wafer has a thickness of not more than about 200 μm, or by forming a taper on the chip side face 1c, it is possible to prevent the inclusion of bubbles in spite of the indented surface. Further, ferrite particles and resin containing ferrite particles generally have an insulating property, thereby eliminating the need for the insulating layer as the foundation layer.

A peeling tool 35 is assembled in such a manner that, for obtaining tension, a ring jig 34 is pasted on an adhesive sheet 33 which is a dicing sheet. Next, as shown in FIG. 6(a), the adhesive sheet 33 of the peeling tool 35 is pasted on the shielding layer 4 on the back side of the semiconductor chip 1.

Next, as shown in FIG. 6(b), the jig 31 that is lightly fixed is peeled, and a curved jig 36 having a curved surface is pressed on, so as to separate the respective semiconductor chips 1.

As another method, the semiconductor chips 1 that are connected via the shielding layer 4 may be separated by another dicing, after peeling the jig 31. Here, a disk-shaped blade for dicing having a uniform thickness is used. This blade for dicing preferably has a thin thickness, and may have a thickness of approximately 30 μm, for example.

The following will explain how the shielding layer 4 is formed on the side faces of the semiconductor chip 1 when the shielding layer 4 is formed with the above-described method. First, a case will be explained where the shielding layer 4 of a conductive material is formed only by sputtering.

As shown in FIG. 7(a), when the groove is formed on the back face of the wafer 20 without subjected to the back face polishing, a sputtering film is formed thinner on side faces of the groove than on the wafer back face because the groove is deep. In contrast, as shown in FIG. 7(b), when the groove is formed on the back face of the wafer 20 whose thickness is reduced after subjected to the back face polishing, the sputtering film is uniformly formed on the side faces of the groove because the groove is not deep. Further, when the taper is formed at the groove, as shown in FIG. 7(c), the sputtering film is uniformly formed on the side faces of the groove as on the back face of the wafer 20.

Next, a case will be explained where the shielding layer 4 is made of a conductive material and is formed by sputtering and subsequent electrolytic plating.

First, as shown in FIG. 8(a), when the groove is formed on the back face of the wafer 20 without subjected to the back face polishing, a plated film is formed thinner on side faces of the groove than on the wafer back face, because the plating liquid does not circulate well inside the deep groove. Further, since the electrolyzation tends to concentrate at edge portions, the plating film swells at the edge portions, thereby causing short-circuiting.

In contrast, as shown in FIG. 8(b), when the groove is formed on the back face of the wafer 20 that is subjected to the back face polishing, the plating film is uniformly formed on the side faces of the groove, because the plating liquid is easily supplied inside the shallow groove, thereby achieving a film thickness almost the same as on the back face of the wafer 20.

Next, when the taper is formed at the groove, as shown in FIG. 8(c), the plating film is uniformly formed on the side faces of the groove, because the plating liquid is easily supplied inside the groove, thereby achieving a film thickness almost the same as on the back face of the wafer 20.

Next, a case will be explained where the shielding layer 4 is made of a resin sheet containing powder ferrite as an example of the electromagnetic wave absorbing material as shown in Embodiment 3 as later described.

First, as shown in FIG. 9(a), when the groove is formed on the back face of the wafer 20 without subjected to the back face polishing, the resin sheet tries to fit the indented surface by being heated under reduced pressure between the resin sheet containing powder ferrite and the wafer 20, but the resin sheet has difficulty in fitting in a bottom portion of the groove because the groove is deep.

In contrast, as shown in FIG. 9(b), when the groove is formed on the back face of the wafer 20 whose thickness is reduced after subjected to the back face polishing, by heating under reduced pressure, the resin sheet containing powder ferrite easily fits in the bottom portion of the groove because the groove is not deep.

Further, when the taper is formed at the groove, as shown in FIG. 9(c), the resin sheet containing powder ferrite easily fits in the bottom portion of the groove even if the wafer 20 is thick.

As described above, in the present embodiment, the chip side face 1c and the chip back face 1b of the semiconductor chip 1 are coated with the shielding layer 4 which shields electromagnetic waves. Namely, the semiconductor chip 1 is directly coated with the shielding layer 4.

With this, it is possible to provide the semiconductor chip 1 capable of being easily manufactured into a smaller semiconductor device compared with a conventional semiconductor device equipped with a shielding cap. This also eliminates the need for manufacturing the shielding cap variously in accordance with different shapes and sizes of the semiconductor devices, so that a pressing mold becomes unnecessary. This obviates the complexities of manufacturing and managing various kinds of shielding caps.

Further, in the present embodiment, the chip back face 1b of the semiconductor chip 1 has a smaller area than the chip front face 1a. Thus, when an insulating layer or the shielding layer 4 is formed on the back and side faces of the semiconductor chip 1, it is possible to uniformly form the layer to have almost the same thickness on the back and side faces of the semiconductor chip 1.

Further, in the semiconductor chip 1 of the present embodiment, the shielding layer 4 is made of a conductive material. This prevents the entrance of electromagnetic waves from the semiconductor chip 1 to the outside or from the outside to the semiconductor chip 1, thereby reducing the effects of noise, etc. In addition to electromagnetic waves, the shielding layer 4 made of a conductive material also prevents the transmission of light, thereby preventing a malfunction due to a photovoltaic effect.

Further, a method for manufacturing the semiconductor chip 1 of the present embodiment is arranged so as to have the steps of (1) fixing the jig 31 on the wafer front face 20a on which the element circuit, the electrode pads 2, and the scribe lines 21 that are formed so as to surround the element circuit and the electrode pads 2 are formed, respectively; (2) forming a groove along each of the scribe lines 21 on a wafer back face which is on a back side of the wafer front face 20a; (3) forming the shielding layer 4 so as to shield electromagnetic waves on the wafer back face having the groove and on a concave portion of the groove; and (4) removing the jig 31 fixed on the wafer front face 20a.

With this, it is possible to provide a method for manufacturing the semiconductor chip 1 whose back and side faces have the electromagnetic wave shielding structure.

The method for manufacturing the semiconductor chip 1 of the present embodiment is so arranged that a taper is formed so that a groove has a wider width on a side of the back face than on a side of the front face, in the step of forming a groove along each of the scribe lines 21 on the back face of the wafer.

With this, when an insulating layer or the shielding layer 4 is formed on the chip back face 1b and the chip side face 1c of the semiconductor chip 1, the layer is uniformly formed to have almost the same thickness on the chip back face 1b and the chip side face 1c. Thus, it is possible to provide a high-quality semiconductor chip 1 of the electromagnetic wave shielding type.

[Second Embodiment]

The following will explain another embodiment of the present invention with reference to FIGS. 10 through 13(a) and 13(b). For ease of explanation, members having the same functions as those shown in the drawings pertaining to the first embodiment above will be given the same reference symbols, and explanation thereof will be omitted here.

A semiconductor chip (semiconductor element) of the present embodiment is also a semiconductor chip of a shielding type. In this semiconductor chip 50, the passivation film 3 is provided on a chip front face 50a that has an element circuit (not shown). The passivation film 3 has the opening 3a only at a portion on the electrode pad 2.

In the present embodiment, the electrode pad 2 is electrically connected to one end of secondary wiring 51, and an insulating layer 52 is formed thereon so as to have an opening 52a to reveal an electrode pad 51a formed with the secondary wiring 51. A taper is formed on a chip side face 50c of the semiconductor chip 50, and the shielding layer 4 is formed on a chip back face 50b and on the chip side face 50c.

When the shielding layer 4 is made of a conductive material, an insulating layer (not shown) is formed as the foundation layer. The shielding layer 4 made of a conductive material is electrically connected via the secondary wiring 51 to the electrode pad 2 which is a ground terminal.

Another end of the secondary wiring 51 is revealed at the opening 52a on the insulating layer 52. The secondary wiring 51 revealed at the opening 52a on the insulating layer 52 is used for external electrical connection. Note that, when the shielding layer 4 is made of an electromagnetic wave absorbing material, there is no need to connect the ground terminal with the shielding layer 4.

Next, a method for manufacturing the semiconductor chip 50 as arranged above will be explained with reference to FIGS. 11(a) through 11(e), 12(a) through 12(c), 13(a), and 13(b).

First, as shown in FIG. 11(a), prepared is a wafer 20 whose front face is provided with the element circuit (not shown), the electrode pads 2, and the passivation film 3 which is formed on a portion except the element circuit, the electrode pads 2, and scribe lines 21.

Next, as shown in FIG. 11(b), after a metal thin film (not shown) is formed by sputtering, a resist 53 is formed to have an almost uniform thickness on an entire surface of the wafer front face 20a on which the element circuit is formed, and then photolithography is carried out so as to form an opening 53a at a portion where the secondary wiring 51 is to be formed.

When the electrode pad 2 is made of Al, a first-layer metal thin film formed by the sputtering may be Ti, Ti—W, Cr, etc., which have functions of adhesion and barrier. Ti—W is used here. Further, when the secondary wiring 51 is made of Cu, a second-layer metal thin film needs to be made of Cu. As described above, a material for the second-layer metal thin film needs to be selected in accordance with a material of the secondary wiring 51. Here, Cu is formed as the second-layer metal thin film, and then Cu, Ni, and Au are sequentially layered by an electrolytic plating method on the opening 53a of the resist 53, thereby forming the secondary wiring. The Cu wiring is used because it is more inexpensive compared with Au and it has good conductivity.

Further, as shown in FIG. 11(c), the Au is formed at the outermost layer because of reasons such that it is capable of being connected to Au wire, etc., capable of being easily connected by soldering, and capable of preventing surface oxidation. The Ni is formed because it can prevent the Cu from diffusing into the surface, and it is required for solder connection. As described above, the semiconductor chip can be connected in various forms, so that the semiconductor chip can be mounted on and applied to various types of semiconductor devices.

Next, as shown in FIG. 11(d), after the secondary wiring 51 is formed, the resist 53 is separated. Generally, the resist 53 can be separated easily by a solvent such as acetone. Then, the Cu and Ti—W metal thin films, which become unnecessary, are sequentially removed by wet etching using the secondary wiring 51 as a mask.

Next, as shown in FIG. 11(e), the insulating layer 52 is formed to protect the secondary wiring 51. The insulating layer 52 is formed in such a method that photosensitive resin varnish is applied and formed into a film, and then photolithography is carried out for patterning. The patterning forms an opening at a desired portion on the scribe lines 21 and on the secondary wiring 51, and then heat treatment is applied for curing.

The following steps are carried out in the same manner as in First Embodiment. Namely, as shown in FIG. 12(a), on a side of an element formed surface on which the secondary wiring 51 and the insulating layer 52 are formed, the wafer 20 is fixed on the jig 31. The jig 31 is made of a material having a smooth surface and sufficient tolerance for later steps. Here, a plate glass jig 31 is used. On a surface of the jig 31, a thermoplastic adhesive agent of polyimide having a glass transition point Tg of not less than 200° C., for example, is applied and formed so as to uniformly have a thin thickness. The jig 31 is only fixed on the wafer 20 so as not to be peeled during the steps, so that thermo compression bonding is lightly carried out at a temperature of approximately 250° C. This adhesion enables separation at a surface of the adhesive agent in the later peeling step.

Following this, as shown in FIG. 12(b), grooves are formed by dicing on a wafer back face 20b of the wafer 20. Note that, a circular blade 32 having different thicknesses at outer and inner circumferential portions is used here. The outer circumferential portion of the blade 32 has a thickness of 50 μm, whereas an inner circumferential portion that is 800 μm radially inside the outer circumferential portion has a thickness of 980 μm. By using this blade 32, a taper is formed on a chip side face 50c of a semiconductor chip 50 that is separated from the wafer 20, allowing a chip front face 50a to have a larger area than a chip back face 50b.

Next, as shown in FIG. 12(c), the insulating layer (not shown) is formed by a photo-assisted CVD method as the foundation layer (not shown) of the shielding layer 4. Using SiH$_4$—N$_2$O as a reactive material, the semiconductor chip 50 is heated at approximately 200° C. in a chamber and irradiated by a mercury lamp, thereby forming the film. Next, the shielding layer 4 is formed in such a manner that Au is formed to have a thickness of approximately 1 μm by sputtering. The shielding layer 4 may be formed thicker by electrolytic Au plating if necessary. Further, the shielding layer 4 may be formed with a conductive material other than Au and, for example, other metal materials such as Cu. In this case, Cu is formed by sputtering. Note that, when it is necessary to form Cu thicker, various methods may be employed such that Cu is further formed by electrolytic plating. Further, other than metal, a material that absorbs electromagnetic waves may be used. For example, when a resin sheet containing powder ferrite is heated under reduced pressure with respect to the jig 31, the resin sheet would fit and adhere to the chip back face 50b and the chip side face 50c of the semiconductor chip 50. In this case, ferrite and resin containing ferrite particles have an insulating property, thereby eliminating the need for the insulating layer as the foundation layer. Further, there is no need to connect the secondary wiring 51 with the shielding layer 4.

A peeling tool 35 is made in such a manner that, for obtaining tension, a ring jig 34 is pasted on an adhesive sheet 33 which is a dicing sheet. Next, as shown in FIG. 13(a), the adhesive sheet 33 of the peeling tool 35 is pasted on the shielding layer 4 on the back side of the semiconductor chip 50.

Next, as shown in FIG. 13(b), the jig 31 that is lightly fixed is peeled, and a curved jig 36 having a curved surface is pressed on, so as to separate the respective semiconductor chips 50.

As described above, in the semiconductor chip 50 of the present embodiment, a secondary wiring 51 is further provided on the wafer front face 20a so as to be electrically connected to the electrode pads 2. Further, the insulating layer 52 is provided on the secondary wiring 51 so as to have the opening 52a for revealing the electrode pad 51a formed with the secondary wiring 51.

Thus, it is possible to flexibly vary a pattern of the secondary wiring 51 and a layout of the opening 52a on the insulating layer 52, thereby easily enabling flip chip connection on a substrate or in the semiconductor device.

Further, in the semiconductor chip 50 of the present embodiment, the shielding layer 4 is electrically connected via the secondary wiring 51 to the electrode pad 2 as a ground terminal of a main body of the semiconductor element. Thus, it is possible to achieve increased effect of preventing the electromagnetic waves, compared with a case where the shielding layer 4 is merely provided. Namely, even though a metal conductor has a characteristic to reflect electromagnetic waves, a small amount of electromagnetic waves transmit the metal conductor. Thus, by electrically connecting the shielding layer 4 with the ground terminal, most of the transmitted electromagnetic waves flow through the metal conductor as electric current, and are earthed.

Further, in the semiconductor chip 50 of the present embodiment, the secondary wiring 51 is further coated with the insulating layer 52.

This prevents short-circuiting with respect to other components and wiring in the device. Further, the insulating layer 52 protects the secondary wiring 51, thus having an effect of preventing corrosion and physical damages, etc. of the secondary wiring 51.

A method for manufacturing the semiconductor chip 50 of the present embodiment may be arranged so as to have the steps of (1) forming the secondary wiring 51 whose one end is electrically connected to the electrode pads 2 provided on a front face of a wafer on which an element circuit, the electrode pads 2, and the scribe lines 21 that are formed so as to surround the element circuit and the electrode pads 2 are formed, respectively; (2) forming the insulating layer 52 so as to have the opening 52a on the secondary wiring 51; (3) fixing the jig 31 on the front face of the wafer; (4) forming a groove along each of the scribe lines 21 on a back face which is on a back side of the wafer front face; (5) forming the shielding layer 4 so as to shield electromagnetic waves on the wafer back face having the groove and on a concave portion of the groove; and (6) removing the jig 31 fixed on the wafer front face.

As a result, it is possible to provide a method for manufacturing the semiconductor element 50 of the electromagnetic wave shielding type, in which a pattern of the secondary wiring 51 and a layout of the opening 52a on the insulating layer 52 can be flexibly varied.

[Third Embodiment]

The following will explain a further embodiment of the present invention with reference to FIGS. 14, 15, and 16(a) to 16(d). For ease of explanation, members having the same functions as those shown in the drawings pertaining to the first and second embodiments above will be given the same reference symbols, and explanation thereof will be omitted here.

In the present embodiment, explained is a semiconductor chip of a shielding type in which a shielding layer is also formed on a front face side of a semiconductor chip (semiconductor element).

In this semiconductor chip 60, the passivation film 3 is provided on a chip front face 60a that has an element circuit (not shown). The passivation film 3 has the opening 3a only at a portion on the electrode pad 2.

In the present embodiment, as in Second Embodiment, the electrode pad 2 is electrically connected to one end of the secondary wiring 51, and an insulating layer 52 is formed thereon so as to have an opening 52a. A taper is formed on a chip side face 60c of the semiconductor chip 60, and the shielding layer 4 is formed on a chip back face 60b and on the chip side face 60c.

When the shielding layer 4 is made of a conductive material, the secondary wiring 51 is electrically connected to the electrode pad 2 which is a ground terminal, and to the shielding layer 4. Further, another end of the secondary wiring 51 is revealed at the opening 52a on the insulating layer 52. Further, the shielding layer 4 is electrically connected to a shielding layer 64 on the circuit formed surface of the semiconductor chip 60. As described above, in the present embodiment, the shielding layer 64 is also formed on the insulating layer 52 on a side of the chip front face 60a.

Further, in the present embodiment, a surface of the shielding layer 4 is coated with an insulating layer 62, and a surface of the shielding layer 64 is coated with an insulating layer 63. The insulating layers 62 and 63 are formed to protect the shielding layers 4 and 64, and to prevent short-circuiting, etc. with respect to other mounted components, etc.

Figure 15:
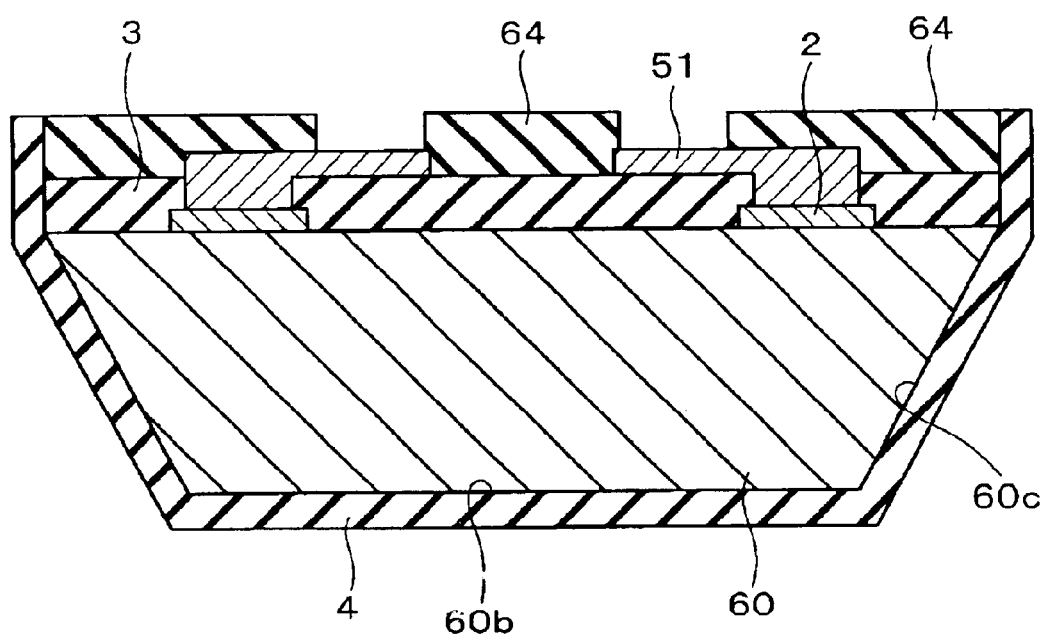
FIG. 15 is a cross-sectional view showing another example of the above semiconductor chip.

Incidentally, in the present embodiment, the shielding layers 4 and 64 are made of a conductive material, but the material is not limited to this. The shielding layers 4 and 64 may be made of an electromagnetic wave absorbing material. In this case, as shown in FIG. 15, it is not required to connect the electrode pad 2 as the ground terminal with the shielding layer 4. Further, the shielding layers 4 and 64 themselves have insulating properties, thereby eliminating the need for the insulating layers 52, 62, and 63 as the foundation and surface-covering layers. Thus, it is possible to obtain the semiconductor chip 60 having an electromagnetic wave shielding structure easier, compared to a case where the shielding layer 4 made of a conductive material is used.

Next, a method for manufacturing the semiconductor chip 60 of the present embodiment will be explained with reference to FIGS. 16(a) through 16(d).

Note that, the steps explained in Second Embodiment are substantially the same as those in the manufacturing method of the present semiconductor chip 60, and thus only different steps will be explained here.

In the present embodiment, as shown in FIG. 11(e), the insulating layer 52 is formed to protect the secondary wiring 51. Further, the insulating layer 52 is formed in such a method that patterning forms an opening at a desired portion on the scribe lines 21 and on the secondary wiring 51, and then heat treatment is applied for curing.

Figure 16:
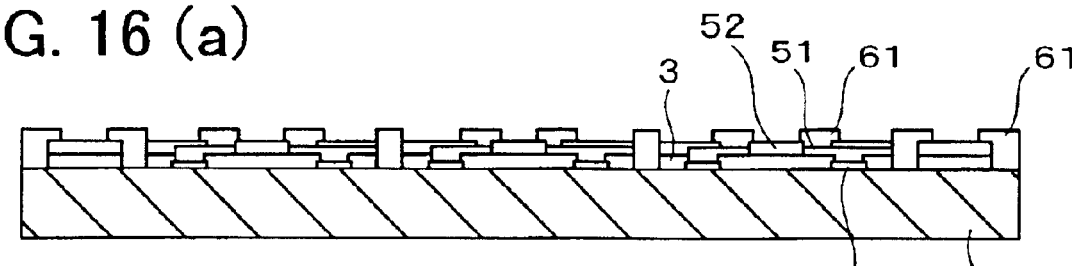
FIGS. 16(*a*) through 16(*d*) are cross-sectional views showing manufacturing steps of the above semiconductor chip.
Figure 16:
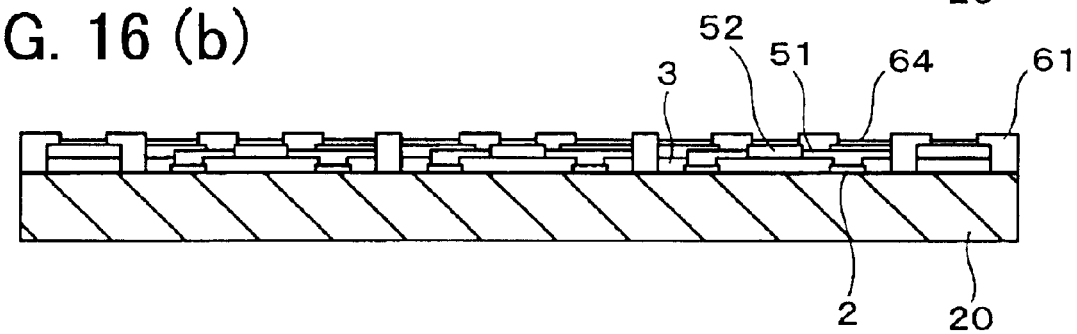
Figure 16:
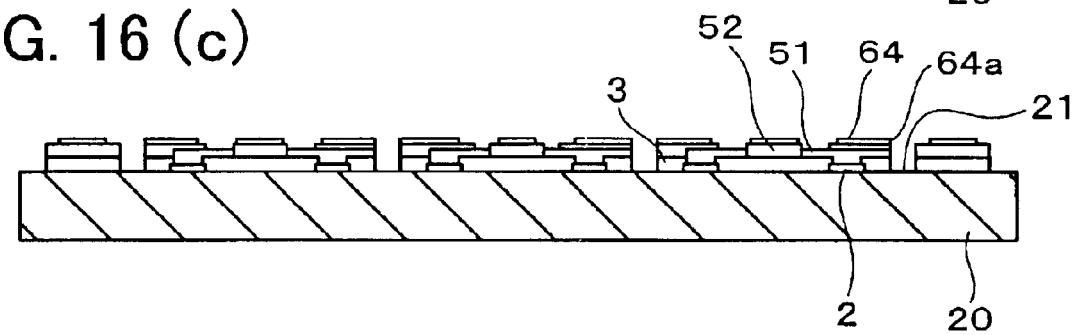
Figure 16:
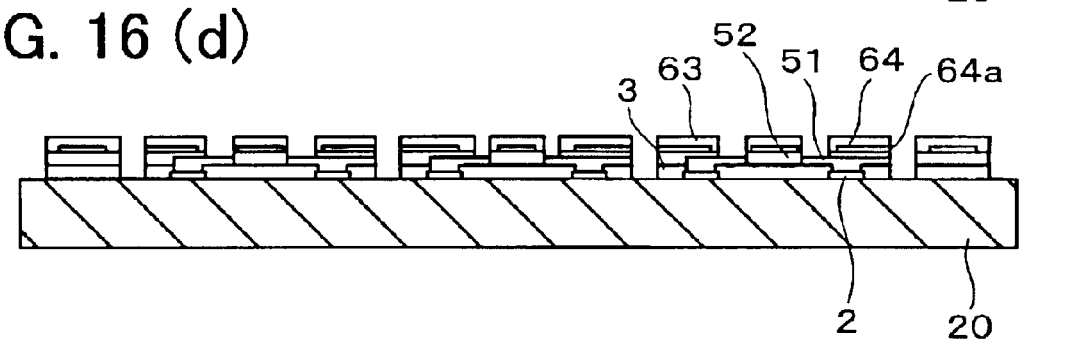

Following this, in the present embodiment, as shown in FIG. 16(a), after Ti—W and Au as metal thin films are formed by sputtering so as to respectively have a thickness of approximately 0.1 μm, a resist 61 is formed on an entire surface of the element formed surface (not shown) of the wafer 20, and then photolithography is carried out so as to form an opening at a portion where the shielding layer 64 is to be formed.

Next, as shown in FIG. 16(b), Au is formed to have a total thickness of 1 μm by an electrolytic plating method. If it is necessary to form Au thicker, a time for plating may be increased. Further, the shielding layer 64 may be formed using a conductive material other than Au and, for example, other metal materials such as Cu. In this case, Cu is formed by sputtering. Note that, when it is necessary to form Cu thicker, various methods may be employed such that Cu is further formed by electrolytic plating.

Next, as shown in FIG. 16(c), the resist 61 is separated using a solvent such as acetone, as in the case with the resist 53. After the resist 61 is separated, the Au and Ti—W metal thin films formed by sputtering, which become unnecessary, are sequentially removed by wet etching using the Au that is formed by electrolytic plating as a mask.

Next, as shown in FIG. 16(d), the insulating layer 63 is further formed on the shielding layer 64. Photosensitive resin varnish is used as a material for forming the insulating layer 63. The photosensitive resin varnish is applied and formed into a film, and then photolithography is carried out for patterning. The patterning forms an opening 64a at a desired portion on the scribe lines 21 and on the secondary wiring 51, and then heat treatment is applied for curing.

The following steps are carried out in the same manner as in FIGS. 3(a) through 3(d) in First Embodiment, or FIGS. 12(a) through 12(c), 13(a), and 13(b) in Second Embodiment.

Incidentally, in the present embodiment, when photosensitive resin containing ferrite particles is used to form the shielding layer 64 on the element formed surface, it is possible to form the opening by photolithography after the pasting. By using resin as a binder having a specific property, as described above, it is possible to improve efficiency in manufacturing steps. For example, when resin having high ductility at heating is pasted on the chip side face 60c and the chip back face 60b of the semiconductor chip 60, the resin easily fits the indented surface, thereby preventing the inclusion of bubbles.

As described above, in the semiconductor chip 60 of the present embodiment, when the shielding layer 4 is made of a conductive material, the chip front face 60a is also coated with the shielding layer 64 for shielding electromagnetic waves. Thus, it is possible to achieve an increased effect of blocking electromagnetic waves and light, compared with a case where the shielding layer 4 covers only the chip back face 60b and chip side face 60c of the semiconductor chip 60. As a result, it is possible to further prevent the generation of noise and the occurrence of a malfunction.

Further, the semiconductor chip 60 of the present embodiment may be so arranged that the shielding layer 4 is made of an electromagnetic wave absorbing material that absorbs electromagnetic waves. This eliminates the influence of reflected electromagnetic waves. Further, since the electromagnetic wave absorbing material generally has an insulating property, there is no need to form an insulating layer as the foundation layer of the shielding layer 4. This also prevents short-circuiting with respect to other components and wiring in the device.

Further, in the semiconductor chip 60 of the present embodiment, when the shielding layer 4 is made of an electromagnetic wave absorbing material, the chip front face 60a may be also coated with an electromagnetic wave absorbing material. Thus, it is possible to achieve an increased effect of blocking electromagnetic waves and light, compared with a case where the shielding layer 4 covers only the chip back face 60b and the chip side face 60c of the semiconductor chip 60. As a result, it is possible to further prevent the generation of noise and the occurrence of a malfunction.

[Fourth Embodiment]

Figure 17:
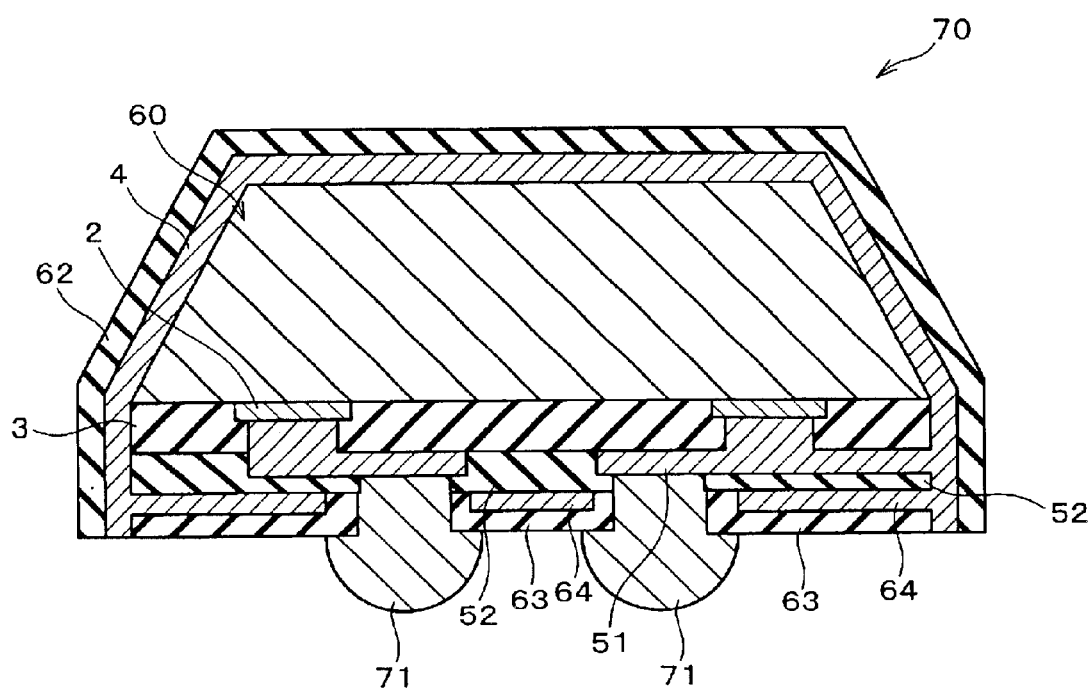
FIG. 17 is a cross-sectional view showing a semiconductor device of the present invention.
Figure 18:
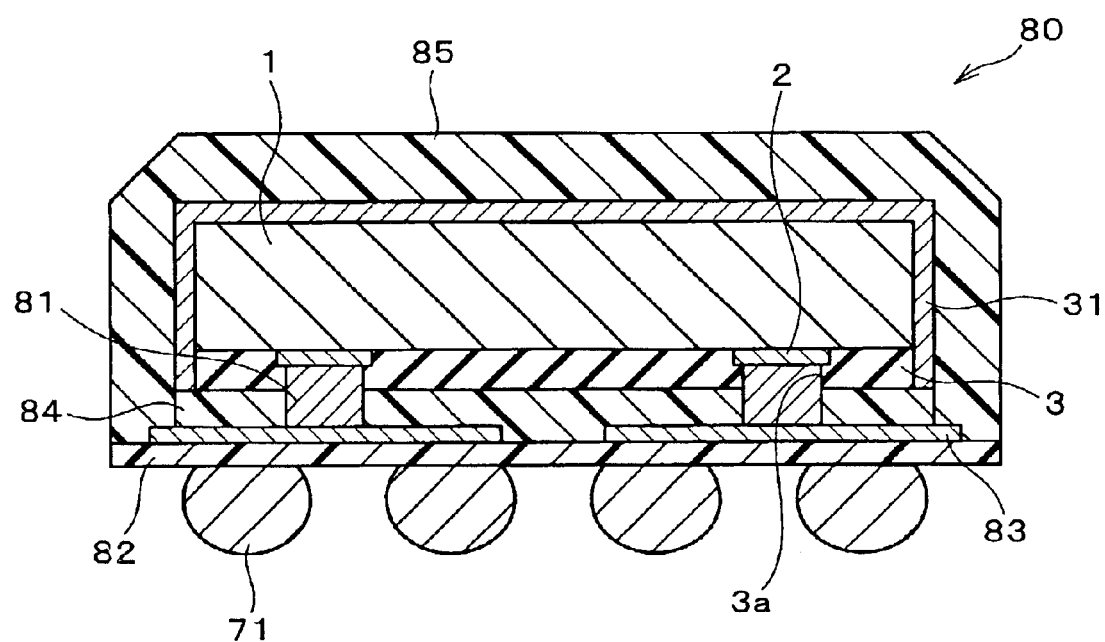
FIG. 18 is a cross-sectional view showing another example of the above semiconductor device.
Figure 19:
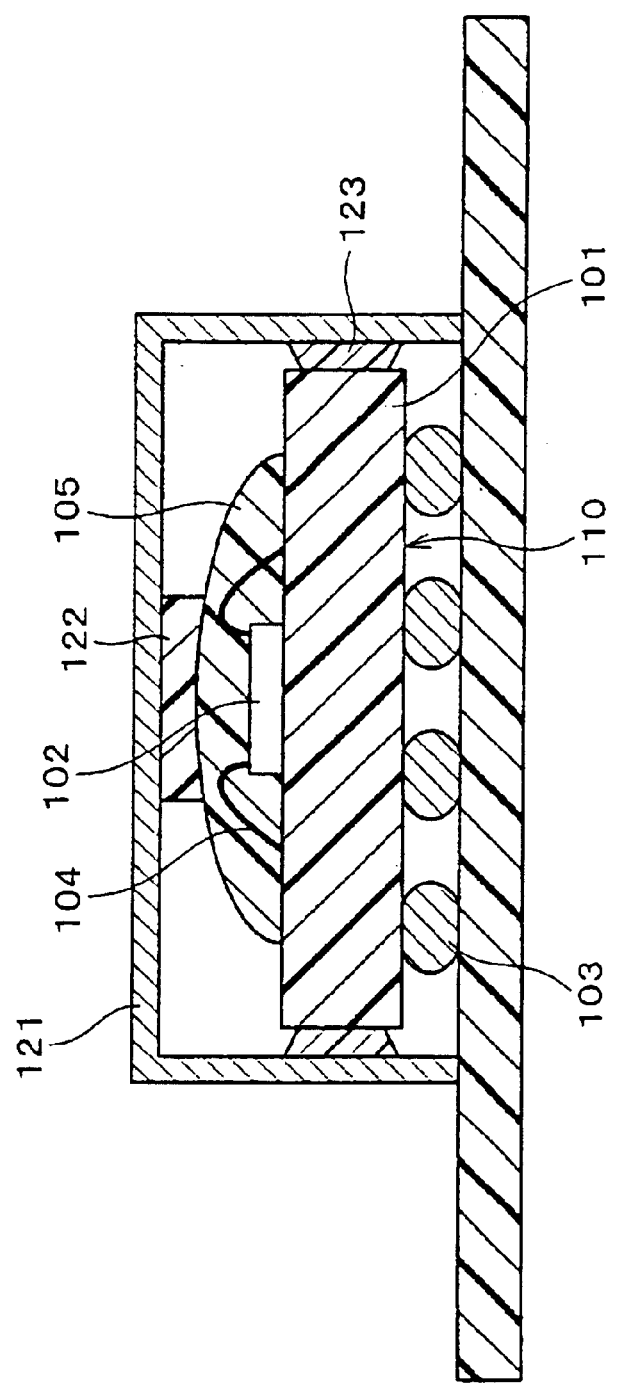
FIG. 19 is a cross-sectional view showing a conventional semiconductor device.

The following will explain yet another embodiment of the present invention with reference to FIGS. 17 and 18. For ease of explanation, members having the same functions as those shown in the drawings pertaining to the first through third embodiments above will be given the same reference symbols, and explanation thereof will be omitted here.

In the present embodiment, explained are examples where a semiconductor chip of the electromagnetic wave shielding type is applied to various types of semiconductor devices.

Figure 14:
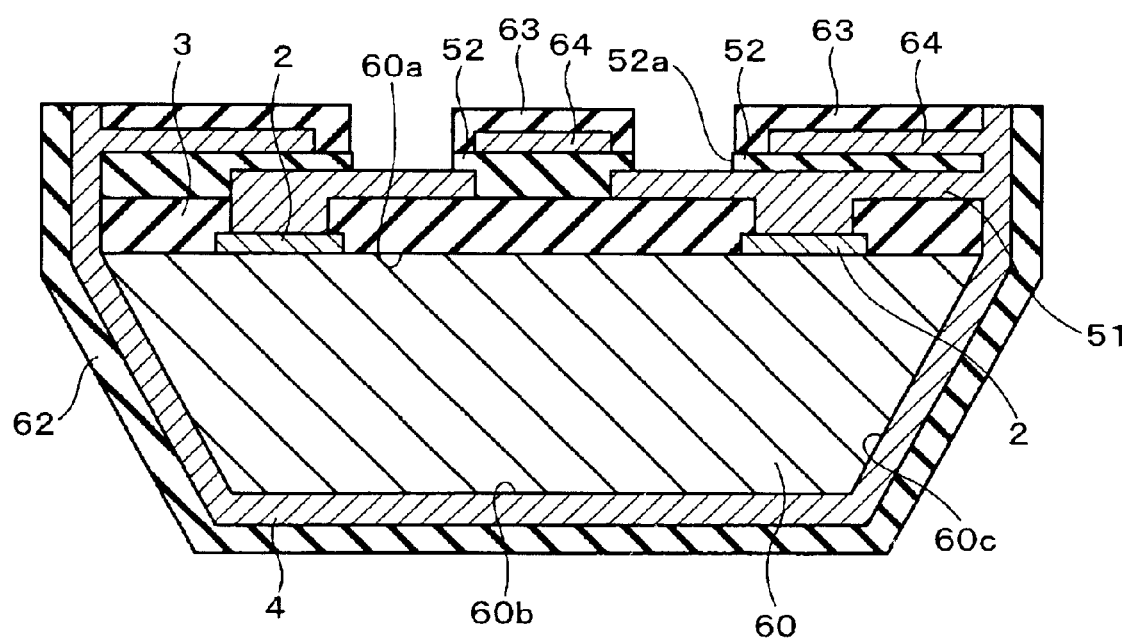
FIG. 14 is a cross-sectional view showing a further embodiment of the semiconductor chip of the present invention.

First, as shown in FIG. 17, a semiconductor device 70 is so arranged that, in the semiconductor chip 60 having the electromagnetic wave shielding structure as shown in FIG. 14 in Third Embodiment, an external connecting terminal 71 is formed on the secondary wiring 51 that is revealed at the opening on the insulating layer 63.

The external connecting terminal 71 may be formed in such a method that, after flux is applied on the opening on the insulating layer 63, a solder ball of Sn—Ag, etc. is mounted by a ball mounting device, and a semispherical bump is obtained through a reflow oven in which heat treatment can be carried out in an atmosphere of $N_2$.

By arranging the secondary wiring 51 to include Au, Ni, and Cu sequentially from the outermost layer, during the heat treatment by the reflow oven, Au facilitates solder wetting so that Ni is alloyed and electrically connected with Sn in the solder. Note that, in cross-sectional views of FIG. 17, two external connecting terminals 71 are shown. The external connecting terminal 71 shown on the right side is electrically connected via the secondary wiring 51 with the electrode pad 2 as the ground terminal, and is electrically connected to both the shielding layers 64. When the external connecting terminal 71 is electrically connected to an earthed terminal on a substrate, increased effect of shielding electromagnetic waves can be attained.

On the other hand, as shown in FIG. 18, a semiconductor device 80 is composed of the semiconductor chip 1 of the shielding type as shown in FIG. 1 in First Embodiment. In the semiconductor device 80, the electrode pad 2 revealed at the opening 3a on the passivation film 3 is electrically connected via a bump 81 to wiring 83 on a wiring substrate (substrate) 82, and the wiring 83 is electrically connected to the external connecting terminal 71. Between the semiconductor chip 1 and the wiring substrate 82, an anisotropic conductive film 84, in which resin contains Ni particles, etc., is provided. By applying thermo compression bonding, the anisotropic conductive film 84 fixes the semiconductor chip 1 onto the wiring substrate 82, and the Ni particles wedge both the bump 81 and the wiring 83 so as to electrically connect them. When the electrode pad 2 is made of Al, Au is frequently used as a bump material, and the bump may be an electrolytic plating bump, an electroless plating bump, a wire bump formed with Au wire, and other bumps. Sealing resin 85 is formed by transfer molding.

Incidentally, the semiconductor chips 1, 50, and 60 as have been explained can be applied to any semiconductor device.

As described above, the semiconductor device 70 of the present embodiment is so arranged that the external connecting terminal 71 is directly formed on the semiconductor chip 60. Further, the semiconductor device 80 is so arranged that the external connecting terminal 71 is indirectly formed on the semiconductor chip 1. Namely, the semiconductor devices 70 and 80 are composed of the semiconductor chips 1, 50 and 60 of the electromagnetic wave shielding type.

With this, it becomes possible to provide the smaller semiconductor devices 70 and 80 compared with the conventional semiconductor device equipped with a shielding cap. This also eliminates the need for manufacturing the shielding cap variously in accordance with different shapes and sizes of the semiconductor devices, so that a pressing mold becomes unnecessary. This obviates the complexities of manufacturing and managing various kinds of shielding caps.

Further, in the semiconductor device 80 of the present embodiment, any one of the semiconductor elements 1, 50 and 60 is provided on the wiring substrate 82 having the wiring 83, the wiring 83 of the wiring substrate 82 being electrically connected to the electrode pads 2 on the front face; the semiconductor chips 1, 50 and 60 being sealed with the sealing resin 85; and the external connecting terminal 71 being provided on the wiring substrate 82 on a back face of a surface having the wiring 83 so as to be electrically connected to a part of the wiring 83.

Only by mounting a semiconductor element of the electromagnetic wave shielding type instead of a conventional semiconductor element on a conventional semiconductor device of a resin sealing type, as describe above, it is possible to obtain the semiconductor device 80 of the electromagnetic wave shielding type. Namely, the semiconductor device 80 of the shielding type has the same exterior appearance as the conventional semiconductor device. Thus, a conventional production line can be used in an assembly process of the semiconductor device 80, thereby enabling substrate packaging without modifying a design of the substrate or changing a mounting jig.

As described above, a semiconductor element of the present invention, whose front face on which an element circuit is formed has electrode pads and whose side face is provided between the front face and a back face on a back side of the front face, is so arranged that the side face and the back face are coated with a shielding layer for shielding electromagnetic waves.

Namely, the conventional semiconductor device has a problem such that the entire size of the semiconductor device becomes very large, because the semiconductor device is covered with a shielding cap.

With the present invention, however, the side and back faces of the semiconductor element are coated with the shielding layer for shielding electromagnetic waves. In other words, the semiconductor element is directly coated with the shielding layer.

As a result, it becomes possible to provide a semiconductor element capable of being easily manufactured into a smaller semiconductor device compared with the conventional semiconductor device equipped with a shielding cap. This also eliminates the need for manufacturing the shielding cap variously in accordance with different shapes and sizes of the semiconductor devices, so that a pressing mold becomes unnecessary. This obviates the complexities of manufacturing and managing various kinds of shielding caps.

The semiconductor element of the present invention may be so arranged that a secondary wiring is further provided on the front face so as to be electrically connected to the electrode pads; and an insulating layer is provided on the secondary wiring so as to have an opening for revealing the electrode pads connected with the secondary wiring.

With this arrangement, a secondary wiring is further provided on the front face of the element so as to be electrically connected to the electrode pads. Further, an insulating layer is provided on the secondary wiring so as to have an opening for revealing the electrode pads connected with the secondary wiring.

Thus, it is possible to flexibly vary a pattern of the secondary wiring and a layout of the opening on the insulating layer, thereby easily enabling flip chip connection on a substrate or in the semiconductor device.

Incidentally, the insulating layer is provided on the secondary wiring, thereby preventing short-circuiting with respect to other components and wiring in the device. Further, the insulating layer protects the secondary wiring, thus having an effect of preventing corrosion and physical damages, etc. of the secondary wiring.

The semiconductor element of the present invention may be so arranged that the back face has a smaller area than the front face.

With this arrangement, the back face of the element has a smaller area than the front face. Thus, when an insulating layer or a shielding layer is formed on the back and side faces of the semiconductor element, it is possible to uniformly form the layer to have almost the same thickness on the back and side faces of the semiconductor element.

The semiconductor element of the present invention may be so arranged that the shielding layer is made of a conductive material.

With this arrangement, the shielding layer is made of a conductive material. This prevents the entrance of electromagnetic waves from the semiconductor element to the outside or from the outside to the semiconductor element, thereby reducing the effects of noise, etc. In addition to electromagnetic waves, the shielding layer made of a conductive material also prevents the transmission of light, thereby preventing a malfunction due to a photovoltaic effect.

The semiconductor element of the present invention may be so arranged that the shielding layer is electrically connected to a ground terminal of a main body of the semiconductor element.

With this arrangement, the shielding layer is electrically connected to a ground terminal of a main body of the semiconductor element. Thus, it is possible to achieve increased effect of preventing the electromagnetic waves, compared with a case where the shielding layer is merely provided. Namely, even though a metal conductor has a characteristic to reflect electromagnetic waves, a small amount of electromagnetic waves transmit the metal conductor. Thus, by electrically connecting the shielding layer with the ground terminal, most of the transmitted electromagnetic waves flow through the metal conductor as electric current, and are earthed.

The semiconductor element of the present invention may be so arranged that the front face is coated with a shielding layer for shielding electromagnetic waves.

With this arrangement, when the shielding layer is made of a conductive material, the front face of the element is also coated with a shielding layer for shielding electromagnetic waves. Thus, it is possible to achieve an increased effect of blocking electromagnetic waves and light, compared with a case where the shielding layer covers only the back and side faces of the semiconductor element.

As a result, it is possible to further prevent the generation of noise and the occurrence of a malfunction.

The semiconductor element of the present invention may be so arranged that the shielding layer is further coated with an insulating layer.

With this arrangement, the shielding layer is further coated with an insulating layer. This prevents short-circuiting with respect to other components and wiring in the device. Further, the insulating layer protects the shielding layer, thus having an effect of preventing corrosion and physical damages, etc. of the shielding layer.

The semiconductor element of the present invention may be so arranged that the shielding layer is made of an electromagnetic wave absorbing material.

With this arrangement, the shielding layer is made of an electromagnetic wave absorbing material that absorbs electromagnetic waves. This eliminates the influence of reflected electromagnetic waves. Further, since the electromagnetic wave absorbing material generally has an insulating property, there is no need to form an insulating layer as the foundation and surface layers of the shielding layer. This also prevents short-circuiting with respect to other components and wiring in the device. Further, in the semiconductor element in which a secondary wiring is further provided on the front face so as to be electrically connected to the electrode pads, and an insulating layer is provided on the secondary wiring so as to have an opening for revealing the electrode pads connected with the secondary wiring, there is no need to connect the secondary wiring with the shielding layer.

The semiconductor element of the present invention may be so arranged that the front face is coated with an electromagnetic wave absorbing material.

With this arrangement, when the shielding layer is made of an electromagnetic wave absorbing material, the front face of the element is also coated with an electromagnetic wave absorbing material. Thus, it is possible to achieve an increased effect of blocking electromagnetic waves and light, compared with a case where the shielding layer covers only the back and side faces of the semiconductor element.

As a result, it is possible to further prevent the generation of noise and the occurrence of a malfunction.

A semiconductor device of the present invention is so arranged that an external connecting terminal is formed on the above-described semiconductor element.

With this arrangement, the semiconductor device is so arranged that an external connecting terminal is formed on the above-described semiconductor element. Namely, the semiconductor device is composed of a semiconductor element of the electromagnetic wave shielding type as arranged above.

With this, it becomes possible to provide a smaller semiconductor device compared with the conventional semiconductor device equipped with a shielding cap. This also eliminates the need for manufacturing the shielding cap variously in accordance with different shapes and sizes of the semiconductor devices, so that a pressing mold becomes unnecessary. This obviates the complexities of manufacturing and managing various kinds of shielding caps.

A semiconductor device of the present invention may be arranged so as to include a substrate having wiring; and the above-described semiconductor element on the substrate, the wiring of the substrate being electrically connected to the electrode pads on the front face; the semiconductor element being sealed with a resin; and an external connecting terminal being provided on the substrate on a back face of a surface having the wiring so as to be electrically connected to a part of the wiring.

With this arrangement, in the semiconductor device, the above-described semiconductor element is provided on a substrate having wiring, the wiring of the substrate being electrically connected to the electrode pads on the front face; the semiconductor element being sealed with a resin; and an electrode pad for an external connecting terminal being provided on the substrate on a back face of a surface having the wiring so as to be electrically connected to a part of the wiring.

Only by mounting a semiconductor element of the electromagnetic wave shielding type instead of a conventional semiconductor element on a conventional semiconductor device of a resin sealing type, as describe above, it is possible to obtain a semiconductor device of the electromagnetic wave shielding type. Namely, the semiconductor device of the shielding type has the same exterior appearance as the conventional semiconductor device. Thus, a conventional production line can be used in an assembly process of the semiconductor device, thereby enabling substrate packaging without modifying a design of the substrate or changing a mounting jig.

A method for manufacturing a semiconductor element of the present invention is arranged so as to have the steps of (1) fixing a sheet or plate material on a front face of a wafer on which an element circuit, electrode pads, and a cutting line that is formed so as to surround the element circuit and the electrode pads are formed, respectively; (2) forming a groove along the cutting line on a back face which is on a back side of the wafer front face; (3) forming a shielding layer so as to shield electromagnetic waves on the wafer back face having the groove and on a concave portion of the groove; and (4) removing the sheet or plate material fixed on the wafer front face, the steps (1) through (4) being processed in this order.

With this method, when manufacturing the semiconductor element, first, (1) a sheet or plate material is fixed on a front face of a wafer on which an element circuit, electrode pads, and a cutting line that is formed so as to surround the element circuit and the electrode pads are formed, respectively. Next, (2) a groove is formed along the cutting line on a back face which is on a back side of the wafer front face. Then, (3) a shielding layer for shielding electromagnetic waves is formed on the wafer back face having the groove and on a concave portion of the groove. After this, (4) the sheet or plate material fixed on the wafer front face is removed.

With this, it is possible to provide a method for manufacturing a semiconductor element whose back and side faces have the electromagnetic wave shielding structure.

A method for manufacturing a semiconductor element of the present invention may be arranged so as to have the steps of (1) forming a secondary wiring whose one end is electrically connected to electrode pads provided on a front face of a wafer on which an element circuit, the electrode pads, and a cutting line that is formed so as to surround the element circuit and the electrode pads are formed, respectively; (2) forming an insulating layer so as to have an opening on the secondary wiring; (3) fixing a sheet or plate material on the front face of the wafer; (4) forming a groove along the cutting line on a back face which is on a back side of the wafer front face; (5) forming a shielding layer so as to shield electromagnetic waves on the wafer back face having the groove and on a concave portion of the groove; and (6) removing the sheet or plate material fixed on the wafer front face, the steps (1) through (6) being processed in this order.

With this method, when manufacturing the semiconductor element, first, (1) a secondary wiring is formed, whose one end is electrically connected to electrode pads provided on a front face of a wafer on which an element circuit, the electrode pads, and a cutting line that is formed so as to surround the element circuit and the electrode pads are formed, respectively. Next, (2) an insulating layer is formed so as to have an opening on the secondary wiring, Then, (3) a sheet or plate material is fixed on the front face of the wafer. Following this, (4) a groove is formed along the cutting line on a back face which is on a back side of the wafer front face.

Further, (5) a shielding layer for shielding electromagnetic waves is formed on the wafer back face having the groove and on a concave portion of the groove. After this, (6) the sheet or plate material fixed on the wafer front face is removed.

As a result, it is possible to provide a method for manufacturing a semiconductor element having the electromagnetic wave shielding structure, in which a pattern of the secondary wiring and a layout of opening on the insulating layer can be flexibly varied.

The method for manufacturing the semiconductor element of the present invention may be so arranged that a taper is formed so that a groove has a wider width on a side of the back face than on a side of the front face, in the step of forming a groove along the cutting line on the back face of the wafer.

With this arrangement, in the step of forming a groove along the cutting line on the back face of the wafer, a taper is formed so that a groove has a wider width on a side of the back face than on a side of the front face.

With this, when an insulating layer or a shielding layer is formed on the back and side faces of the semiconductor element, the layer is uniformly formed to have almost the same thickness on the back and side faces. Thus, it is possible to provide a high-quality semiconductor element of the electromagnetic wave shielding type.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor element comprising:
a chip having a front face on which an element circuit is formed, the front face of the chip supporting electrode pads and an insulating layer, the insulating layer having openings provided therein at locations so as to expose the electrode pads, and wherein the chip further has a side face(s) provided between said front face and a back face on a back side of said front face, wherein:
only said side face(s) and said back face are coated with a shielding layer for shielding electromagnetic waves, so that areas of said insulating layer on the front face of the chip between adjacent electrode pads do not contact the shielding layer.

2. The semiconductor element as set forth in claim 1, wherein: said back face has a smaller area than said front face.

3. The semiconductor element as set forth in claim 1, wherein said shielding layer is made of an electromagnetic wave absorbing material.

4. The semiconductor element as set forth in claim 3, wherein: said front face is coated with an electromagnetic wave absorbing material.

5. The semiconductor element as set forth in claim 4, wherein: the electromagnetic wave absorbing material with which said front face is coated is a photosensitive resin.

6. The semiconductor element as set forth in claim 1, wherein: said shielding layer is made of a conductive material.

7. The semiconductor element as set forth in claim 6, wherein: the conductive material is Au.

8. The semiconductor element as set forth in claim 6, wherein: the conductive material is Cu.

9. The semiconductor element as set forth in claim 6, wherein: said shielding layer is electrically connected to a ground terminal of a main body of said semiconductor element.

10. The semiconductor element as set forth in claim 6, wherein: said shielding layer is further coated with an insulating layer.

11. The semiconductor element as set forth in claim 1, wherein:

a secondary wiring is further provided on said front face so as to be electrically connected to the electrode pads; and another insulating layer is provided on said secondary wiring so as to have an opening for revealing parts of said secondary wiring.

12. The semiconductor element as set forth in claim 11, wherein: said shielding layer is made of an electromagnetic wave absorbing material.

13. The semiconductor element as set forth in claim 11, wherein: said shielding layer is made of a conductive material.

14. The semiconductor element as set forth in claim 13, wherein: said shielding layer is electrically connected to a ground terminal of a main body of said semiconductor element.

15. A semiconductor device comprising:

an external connecting terminal formed on a semiconductor element, the semiconductor element having a front face on which electrode pads and an element circuit are formed and whose side face is provided between said front face and a back face on a back side of said front face, said side face and said back face being coated with a shielding layer for shielding electromagnetic waves, and wherein said shielding layer is electrically connected to at least one of the electrode pads on the front face via at least one wiring formed on an insulating layer which is formed on the front face of the element and has apertures therein for exposing the electrode pads.

16. The semiconductor device as set forth in claim 15, wherein said shielding layer of said semiconductor element is made of a conductive material and is connected to a ground terminal of a main body of said semiconductor element, said external connecting terminal being electrically connected to the ground terminal.

17. A semiconductor device, comprising:

a substrate having wiring; and a semiconductor element on said substrate, whose front face on which an element circuit is formed has electrode pads and whose side face is provided between said front face and a back face on a back side of said front face, said side face and said back face being coated with a shielding layer for shielding electromagnetic waves, the wiring of the substrate being electrically connected to the electrode pads on said front face;

said semiconductor element being sealed with a resin;

an external connecting terminal being provided on said substrate on a back face of a surface having the wiring so as to be electrically connected to a part of the wiring; and said shielding layer being electrically connected to at least one of the electrode pads on the front face via at least one wiring formed on an insulating layer which is formed on the front face of the element and has apertures therein for exposing the electrode pads.

18. A semiconductor element comprising a front face on which an element circuit and electrode pads are formed, and a side face provided between said front face and a back face on a back side of said front face, wherein:

said side face and said back face are coated with a shielding layer for shielding electromagnetic waves, wherein said shielding layer is made of an electromagnetic wave absorbing material comprising a photosensitive resin.

* * * * *